(12) United States Patent
Asaba et al.

(10) Patent No.: US 9,759,786 B2
(45) Date of Patent: Sep. 12, 2017

(54) MAGNETIC RESONANCE APPARATUS AND METHOD FOR PREPARING A SENSITIVITY MAP

(71) Applicant: GE Medical Systems Global Technology Company, LLC, Waukesha, WI (US)

(72) Inventors: Yusuke Asaba, Toyko (JP); Ken Arai, Toyko (JP); Janeiro Aguilar, Tokyo (JP); Mitsuhiro Bekku, Tokyo (JP); Miho Nagasawa, Tokyo (JP)

(73) Assignee: General Electric Company, Schenectady, NY (US)

( * ) Notice: Subject to any disclaimer, the term of this patent is extended or adjusted under 35 U.S.C. 154(b) by 1112 days.

(21) Appl. No.: 13/930,107

(22) Filed: Jun. 28, 2013

(65) Prior Publication Data

US 2014/0002083 A1 Jan. 2, 2014
US 2014/0253123 A9 Sep. 11, 2014

(30) Foreign Application Priority Data

Jun. 29, 2012 (JP) ................................. 2012-146767

(51) Int. Cl.
| | | |
|---|---|---|
| G01R 33/32 | (2006.01) | |
| G01R 33/3415 | (2006.01) | |
| G01R 33/54 | (2006.01) | |
| G01R 33/34 | (2006.01) | |

(52) U.S. Cl.
CPC ......... *G01R 33/32* (2013.01); *G01R 33/3415* (2013.01); *G01R 33/543* (2013.01); *G01R 33/34084* (2013.01)

(58) Field of Classification Search
CPC .. G01R 33/32; G01R 33/543; G01R 33/3415; G01R 33/34084
See application file for complete search history.

(56) References Cited

U.S. PATENT DOCUMENTS

| | | | | |
|---|---|---|---|---|
| 6,522,140 B2* | 2/2003 | Harvey | .............. | G01R 33/3415 324/307 |
| 6,825,660 B2* | 11/2004 | Boskamp | ......... | G01R 33/34046 324/318 |
| 6,949,928 B2* | 9/2005 | Gonzalez Ballester | ................... | G01R 33/5611 324/307 |

(Continued)

FOREIGN PATENT DOCUMENTS

| | | |
|---|---|---|
| CN | 1792325 A | 6/2006 |
| CN | 102138791 A | 8/2011 |

(Continued)

*Primary Examiner* — Dixomara Vargas

(57) ABSTRACT

A magnetic resonance apparatus configured to select a coil mode that includes a combination of coil elements to be used when a subject is scanned from within a plurality of coil elements and configured to execute a predetermined scan for acquiring data on the subject using the selected coil mode is provided. The magnetic resonance apparatus includes a coil device having n coil modes, a selecting unit configured to select, from within the n coil modes, a candidate for the selected coil mode, a scanning unit configured to execute a first scan for acquiring the data on the subject using the candidate, and a sensitivity map preparing unit configured to prepare a sensitivity map of the candidate based on data obtained by the first scan.

12 Claims, 31 Drawing Sheets

(56) References Cited

U.S. PATENT DOCUMENTS

| | | | |
|---|---|---|---|
| 7,026,818 B2 * | 4/2006 | Machida | G01R 33/3415 324/309 |
| 7,176,689 B2 * | 2/2007 | Machida | G01R 33/3415 324/318 |
| 7,202,666 B2 * | 4/2007 | Wang | G01R 33/5611 324/309 |
| 7,385,397 B2 | 6/2008 | Uchizono et al. | |
| 7,570,054 B1 * | 8/2009 | Lin | G01R 33/34084 324/307 |
| 7,576,536 B2 * | 8/2009 | Akao | G01R 33/5611 324/307 |
| 7,589,530 B2 * | 9/2009 | Habara | G01R 33/3635 324/318 |
| 7,639,012 B2 * | 12/2009 | Habara | G01R 33/3635 324/318 |
| 7,830,147 B2 | 11/2010 | Okamoto et al. | |
| 8,080,997 B2 * | 12/2011 | Kassai | G01R 33/56518 324/307 |
| 8,093,894 B2 | 1/2012 | Machida et al. | |
| 8,188,738 B2 * | 5/2012 | Hori | G01R 33/5611 324/318 |
| 8,299,793 B2 * | 10/2012 | Riederer | G01R 33/34046 324/318 |
| 8,384,383 B2 | 2/2013 | Frahm et al. | |
| 8,400,152 B2 * | 3/2013 | Lin | G01R 33/5611 324/309 |
| 8,427,153 B2 * | 4/2013 | Hu | G01R 33/3415 324/309 |
| 8,427,156 B2 | 4/2013 | Kholmovski et al. | |
| 8,488,860 B2 * | 7/2013 | Uchizono | G01R 33/561 382/131 |
| 8,581,589 B2 * | 11/2013 | Wald | G01R 33/3415 324/318 |
| 8,749,233 B2 * | 6/2014 | Littmann | A61B 5/055 324/307 |
| 2005/0206379 A1 | 9/2005 | Kojima | |
| 2007/0210793 A1 | 9/2007 | Kiefer | |
| 2009/0202122 A1 | 8/2009 | Wang | |
| 2010/0215225 A1 | 8/2010 | Kadomura et al. | |
| 2011/0228995 A1 | 9/2011 | Batman et al. | |
| 2012/0163692 A1 | 6/2012 | Harvey et al. | |
| 2013/0099786 A1 | 4/2013 | Huang et al. | |

FOREIGN PATENT DOCUMENTS

| | | |
|---|---|---|
| JP | 2006129937 A1 | 5/2006 |
| JP | 2006175058 A | 7/2006 |
| JP | 20080212449 A | 9/2008 |
| JP | 2008283994 A | 11/2008 |
| JP | 2011036452 A | 2/2011 |
| JP | 2011098031 A | 5/2011 |
| JP | 20110115561 A | 6/2011 |
| JP | 2011156096 | 8/2011 |
| JP | 2011156096 A | 8/2011 |
| JP | 2012045192 A1 | 3/2012 |
| JP | 2012090882 A1 | 5/2012 |

* cited by examiner (1) COIL MODE Set1: FRONT ARRAY COIL 40 + REAR ARRAY 41a
(2) COIL MODE Set2: FRONT ARRAY COIL 40 + REAR ARRAY 41b
(3) COIL MODE Set3:                           REAR ARRAY 41a
(4) COIL MODE Set4:                           REAR ARRAY 41b

MAGNETIC RESONANCE APPARATUS AND METHOD FOR PREPARING A SENSITIVITY MAP

CROSS REFERENCE TO RELATED APPLICATIONS

This application claims the benefit of Japanese Patent Application No. 2012-146767 filed Jun. 29, 2012, which is hereby incorporated by reference in its entirety.

BACKGROUND OF THE INVENTION

The present invention relates to a magnetic resonance apparatus that selects a coil mode, and a method for preparing a sensitivity map of a coil device having n coil modes.

A technique of automatically recognizing a combination of coil elements to be used when a subject is scanned is known (see, for example, Japanese Patent Application Laid-Open No. 2011-156096).

In a general technique of automatically recognizing a combination of coil elements, a coil installation position is fixed. Thus, there is such a disadvantage that coils which can be used are limited.

On the other hand, although a magnetic resonance apparatus in which a position of an Anterior coil is detected by using a positioning sensor which is called IntelliTouch is known, it is necessary for an operator to operate the positioning sensor and hence there is such a problem that a workload on the operator is increased in this magnetic resonance apparatus.

In addition, the Anterior coil is made of a soft material so as to be deformable in many cases, and hence the shape of the Anterior coil changes depending on the body shape of a subject. As the shape of the Anterior coil is deformed, sensitivity is changed accordingly, so that there is such a problem that it becomes difficult to select an optimum coil.

Further, it becomes also important to select a combination of coil elements suited for imaging in a short time from the viewpoint of reducing an imaging time.

For reasons as mentioned above, it is desired to select the combination of coil elements suited for scanning the subject in a short time with as little the load on the operator as possible.

BRIEF DESCRIPTION OF THE INVENTION

In one aspect, a magnetic resonance apparatus is provided. The magnetic resonance apparatus selects a coil mode indicating a combination of coil elements to be used when a subject is scanned from within a plurality of coil elements, and executes a predetermined scan for acquiring data on the subject by using the selected coil mode, the magnetic resonance apparatus having a coil device having n coil modes, a selecting unit selecting a candidate for the coil mode to be used when the predetermined scan is executed from within the n coil modes, a scanning unit executing a first scan for acquiring the data on the subject by using the candidate for the coil mode and a sensitivity map preparing unit preparing a sensitivity map of the candidate for the coil mode on the basis of the data obtained by the first scan.

In another aspect, a program of a magnetic resonance apparatus is provided. The program selects a coil mode indicating a combination of coil elements to be used when a subject is scanned from within a plurality of coil elements, and executes a predetermined scan for acquiring data on the subject by using the selected coil mode, the program making a computer execute a selecting process of selecting a candidate for a coil mode to be used when the predetermined scan is executed from within n coil modes and a sensitivity map preparing process of preparing a sensitivity map of the candidate for the coil mode.

Since the sensitivity map of the coil mode is prepared, the sensitivity map according to the shape of the coil can be obtained regardless of deformation of the shape of the coil. Thus, it becomes possible to select a coil mode suited for a predetermined scan. In addition, since the candidate for the coil mode to be used for the predetermined scan is selected before preparation of the sensitivity map, there is no need to perform a first scan using each of the n coil modes and it becomes possible to select the coil mode suited for the predetermined scan in a short time.

Advantages of the embodiments described herein will be apparent from the following description as illustrated in the accompanying drawings.

DETAILED DESCRIPTION OF THE INVENTION

Although exemplary embodiments will be described in the following, the disclosure is not limited to the following exemplary embodiments.

Figure 1:
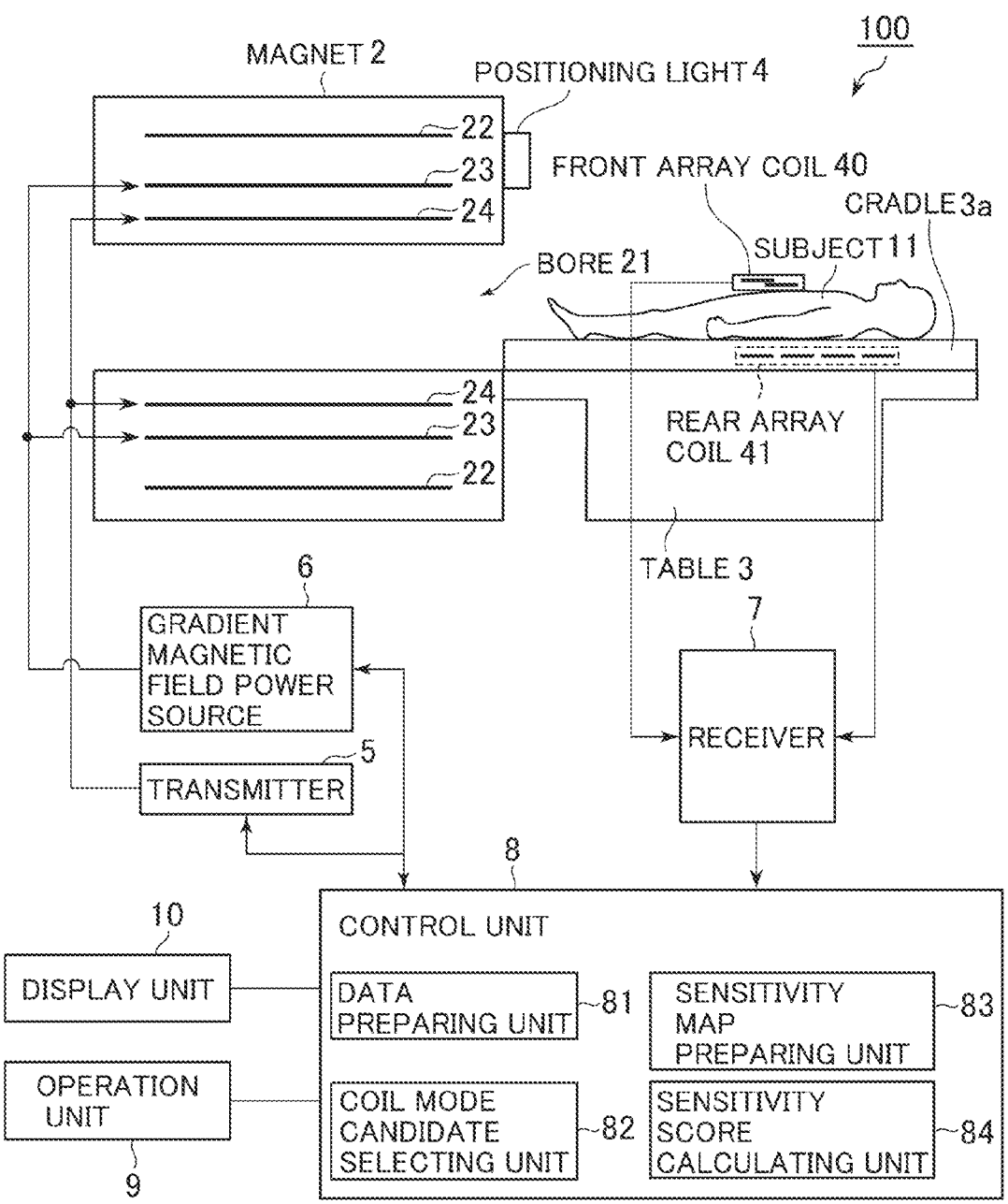
FIG. 1 is a schematic diagram of a magnetic resonance apparatus of one embodiment.

FIG. 1 is a schematic diagram of a magnetic resonance apparatus according to one embodiment.

A magnetic resonance apparatus (hereinafter, referred to as an "MR apparatus") 100 has a magnet 2, a table 3, a positioning light 4, the front array coil 40, the rear array coil 41 and the like.

The magnet 2 has a bore 21 in which a subject 11 is contained, a superconductive coil 22, a gradient coil 23, and the RF coil 24. The superconductive coil 22 forms a static magnetic field, the gradient coil 23 generates a gradient magnetic field, and the RF coil 24 transmits an RF pulse. Incidentally, a permanent magnet may be used in place of the superconductive coil 22.

The positioning light 4 is disposed on a front face of the magnet 2. The positioning light 4 sets the landmark which will serve as a mark when the subject 11 is to be conveyed into the bore 21.

The table 3 has a cradle 3a for supporting the subject 11. The cradle 3a is configured to be movable within the bore 21. The subject 11 is conveyed into the bore 21 by the cradle 3a.

The front array coil 40 is attached to the abdomen of the subject 11. In addition, the rear array coil 41 is embedded in the cradle 3a. A combination of the front array coil 40 and the rear array coil 41 corresponds to a coil device. Structures of the front array coil 40 and the rear array coil 41 will be described later.

The MR apparatus 100 also has a transmitter 5, a gradient magnetic field power source 6, a receiver 7, a control unit 8, an operation unit 9, the display unit 10 and the like.

The transmitter 5 supplies a current to the RF coil 24, and the gradient magnetic field power source 6 supplies a current to the gradient coil 23.

The receiver 7 executes signal processing such as wave detection and the like on signals received from the front array coil 40 and the rear array coil 41. Incidentally, a combination of the magnet 2, the transmitter 5 and the gradient magnetic field power source 6 corresponds to a scanning unit.

The control unit 8 controls operations of respective parts of the MR apparatus 100 so as to implement various operations of the MR apparatus 100 such as an operation of transferring required information to the display unit 10, an operation of reconstructing an image on the basis of data received from the receiver 7 and others. The control unit 8 is configured by, for example, a computer. The control unit 8 has a data preparing unit 81 to a sensitivity score calculating unit 84 and others.

The data preparing unit 81 prepares coverage data (see FIG. 15) of coil modes. The coil modes will be described later.

Figure 4:
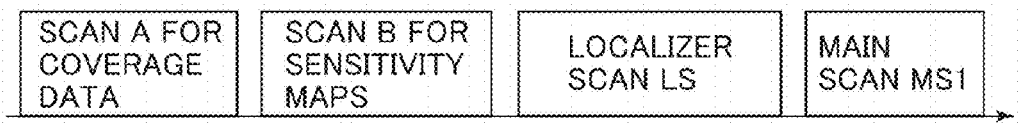
FIG. 4 is a diagram showing scans executed in the exemplary embodiment.

A coil mode candidate selecting unit 82 selects candidates for coil modes used in a localizer scan LS and a main scan MS1 (see FIG. 4).

A sensitivity map preparing unit 83 prepares sensitivity maps of the coil modes.

The sensitivity score calculating unit 84 calculates sensitivity scores of the coil modes.

The control unit 8 is one example configuring the data preparing unit 81 to the sensitivity score calculating unit 84 and functions as these units by executing a predetermined program.

The operation unit 9 is operated by an operator to input various pieces of information into the control unit 8. The display unit 10 displays various pieces of information.

The MR apparatus 100 is configured as mentioned above.

Next, the structures of the front array coil 40 and the rear array coil will be described (see FIGS. 2A and 2B).

Figure 2A:
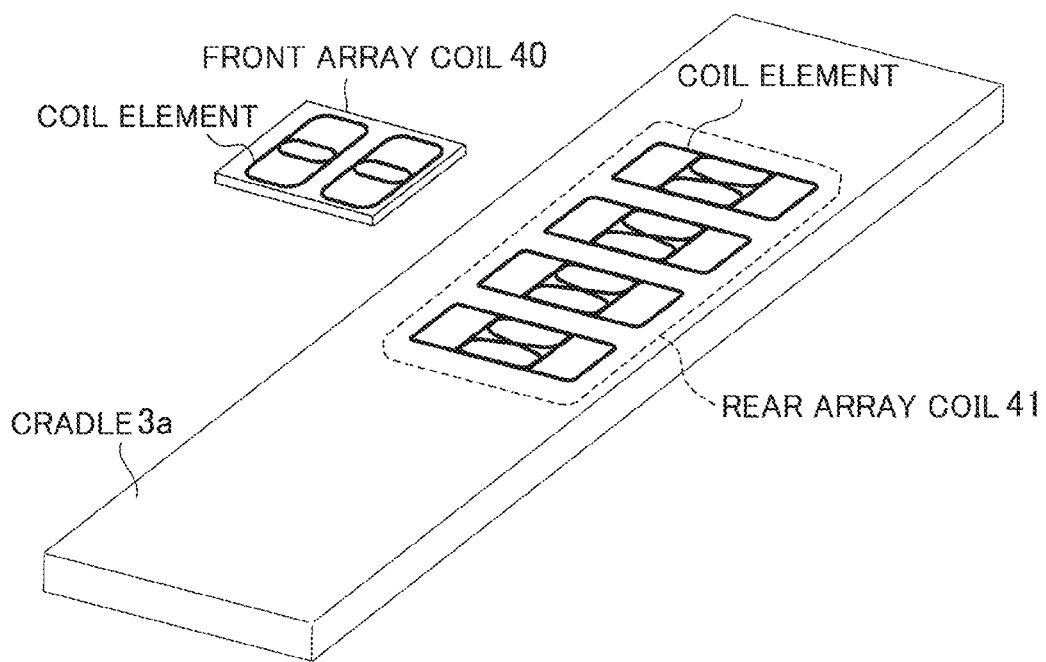
FIGS. 2A and 2B are diagrams showing structures of a front array coil and a rear array coil.
Figure 2B:
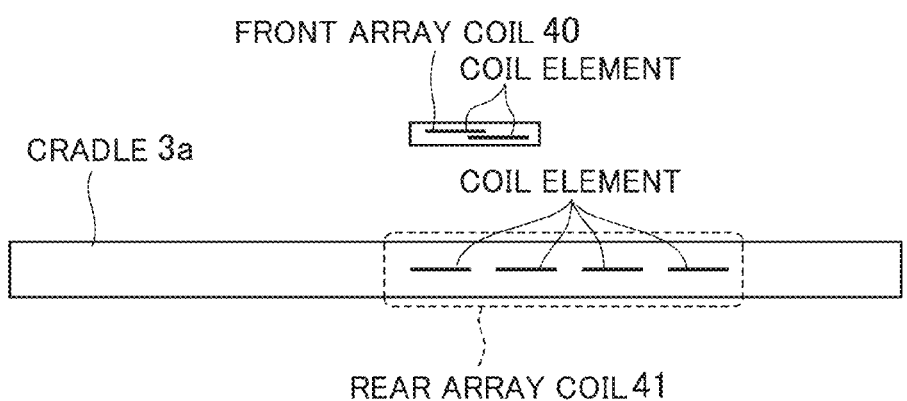

FIGS. 2A and 2B are diagrams showing the structures of the front array coil 40 and the rear array coil 41.

FIG. 2A is a perspective view of the front array coil 40 and the rear array coil 41, and FIG. 2B is a side view of the front array coil 40 and the rear array coil 41.

The front array coil 40 is a coil which is attached to a part to be imaged (the abdomen in the exemplary embodiment) of the subject. The front array coil 40 is configured by a plurality of coil elements.

The rear array coil 41 is a coil which is embedded in the cradle 3a. The rear array coil 41 is also configured by a plurality of coil elements.

Figure 3:
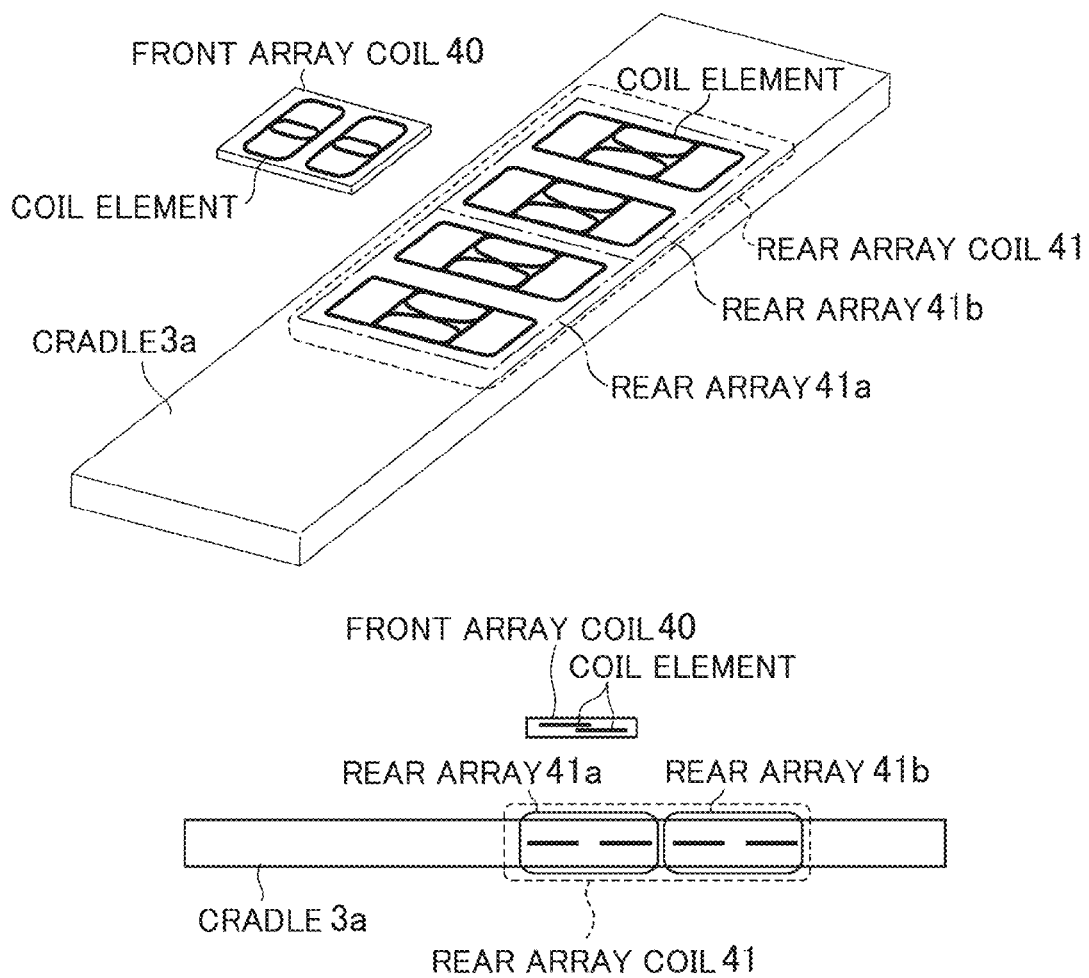
FIG. 3 is an explanatory diagram of coil modes.

When the subject is to be imaged, a coil element which is used for a scan is selected from within the coil elements that the front array coil 40 and the rear array coil 41 have in accordance with imaging conditions (see FIG. 3).

FIG. 3 is an explanatory diagram showing combinations of coil elements which can be used when the subject is scanned in the exemplary embodiment.

In the exemplary embodiment, the rear array coil 41 is divided into two parts (a rear array 41a and a rear array 41b) so as to set such that the coil modes Set1 to Set4 described as follows can be used.

(1) The coil mode Set1: the front array coil 40+the rear array 41a (2) The coil mode Set2: the front array coil 40+the rear array 41b (3) The coil mode Set3: the rear array 41a (4) The coil mode Set4: the rear array 41b When the subject is to be imaged, a coil mode conforming to the imaging conditions is selected from within the coil modes Set1 to Set4. How the coil mode is selected will be described later. Incidentally, although the coil mode is configured by the plurality of coil elements in the above mentioned example, the coil mode may be configured by only one coil element.

Figure 5:
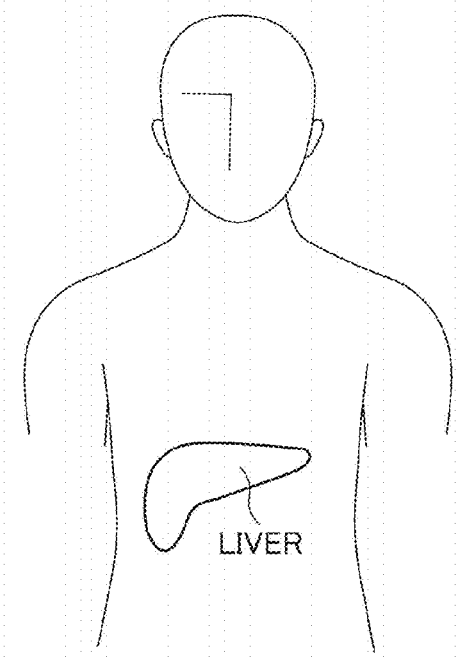
FIG. 5 is a diagram schematically showing a part to be imaged.

FIG. 4 is a diagram showing scans executed in the exemplary embodiment, and FIG. 5 is a diagram schematically showing a part to be imaged.

In the exemplary embodiment, the scan A for coverage data, the scan B for sensitivity maps, the localizer scan LS and the main scan MS1 are executed.

The scan A for coverage data is a scan to be executed to prepare later described coverage data. The scan A for coverage data will be described in detail later.

The scan B for sensitivity maps is a scan to be executed to prepare later described sensitivity maps. The scan B for sensitivity maps will be also described in detail later.

The localizer scan LS is a scan for acquiring localizer image data to be used when a slice position is set.

The main scan MS1 is a scan for collecting image data on a part including the liver. The main scan MS1 is a scan for collecting, for example, T1 emphasized image data and T2 emphasized image data.

In the following, a flow when the subject is imaged by executing the scans shown in FIG. 4 will be described.

Figure 6:
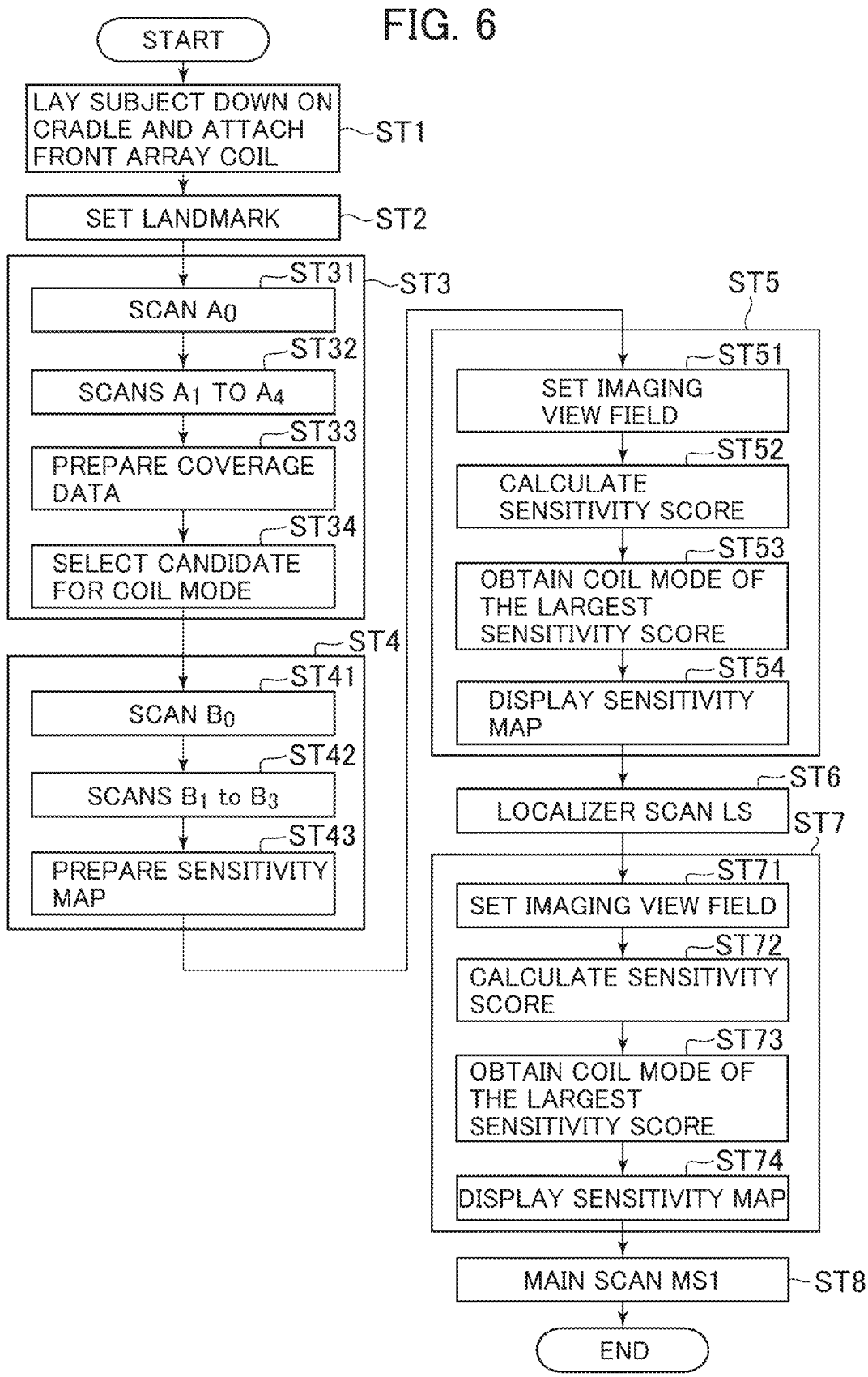
FIG. 6 is a chart showing a flow when a subject is imaged.

FIG. 6 is a chart showing the flow when the subject is imaged.

Figure 7:
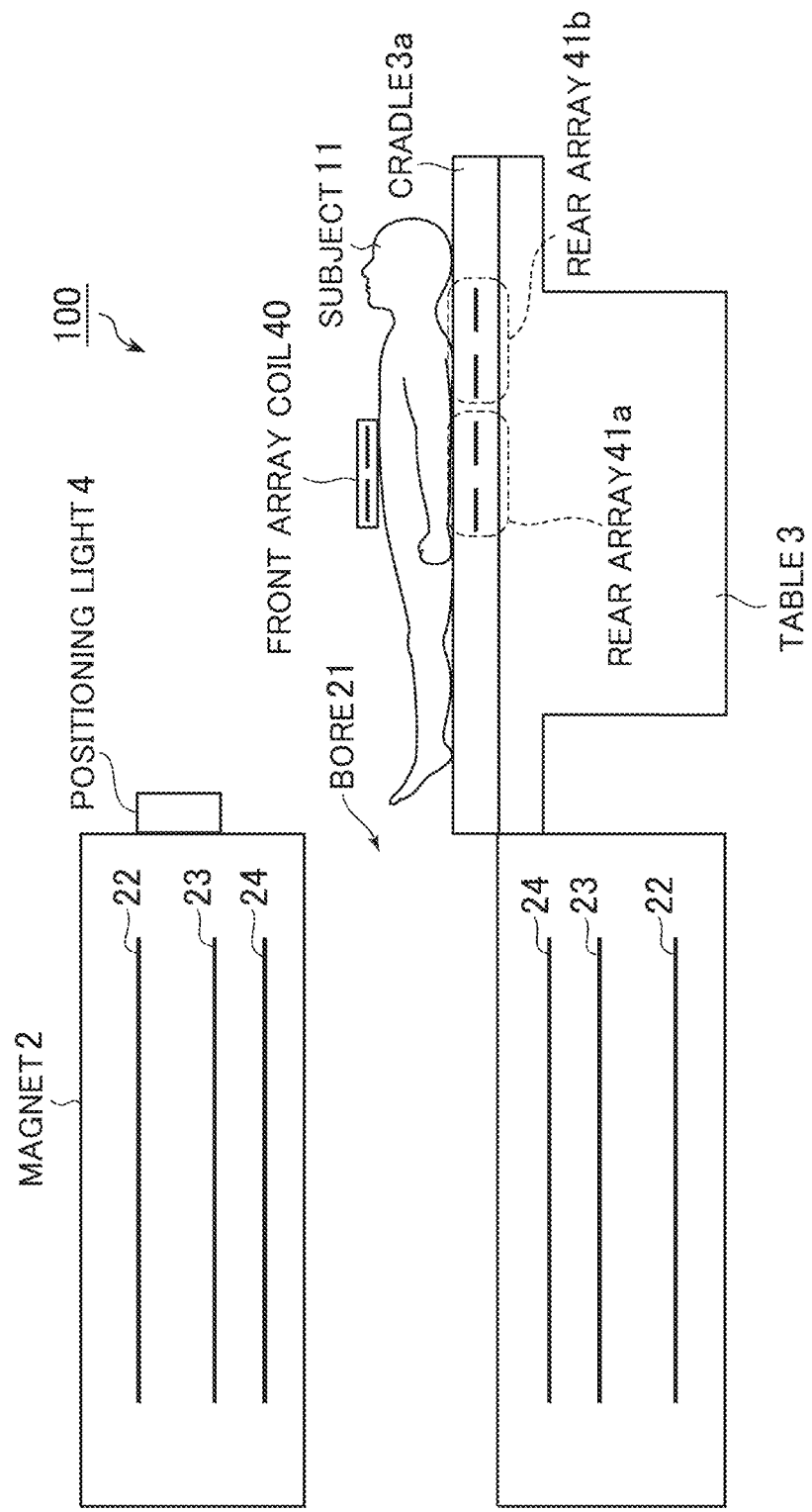
FIG. 7 is a diagram showing a state where the front array coil has been attached to the subject.

In step ST1, the subject 11 is laid down on the cradle 3a and then the front array coil 40 is attached onto it. FIG. 7 schematically shows a state that the front array coil 40 has been attached onto the subject 11. In the exemplary embodiment, since the abdomen of the subject 11 will be imaged, the operator attaches the front array coil 40 onto the abdomen of the subject 11. After the front array coil 40 has been attached, the flow proceeds to step ST2.

Figure 8:
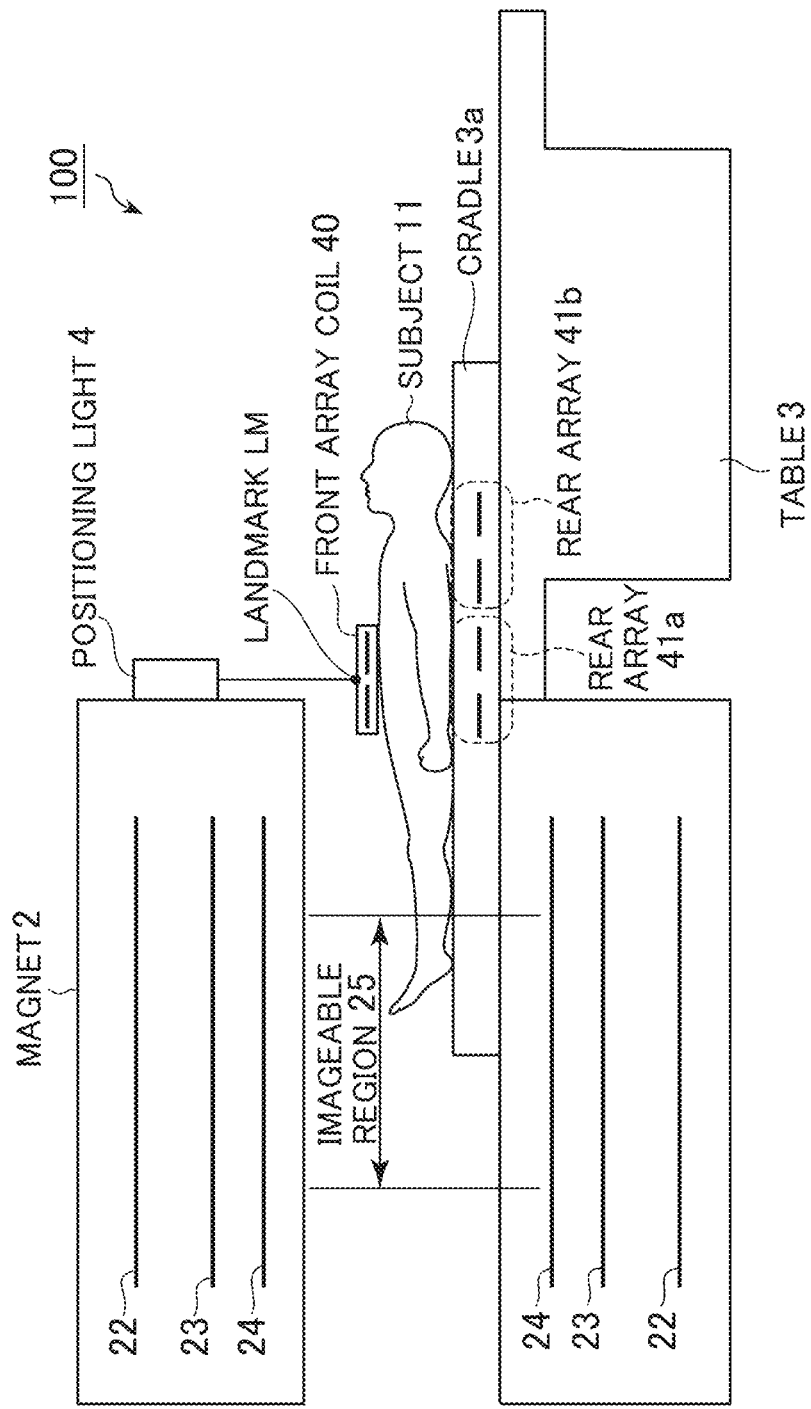
FIG. 8 is a diagram showing an example of a landmark LM.

In step ST2, the operator sets the landmark to be served as a mark when the subject 11 is carried into the bore 21 by using light from the positioning light 4. One example of the set landmark LM is shown in FIG. 8. The operator moves the cradle 3a until the abdomen of the subject 11 is positioned under the positioning light 4 and sets the landmark LM. An example in which the landmark LM has been set on a central position of the front array coil 40 is shown in FIG. 8.

Figure 9:
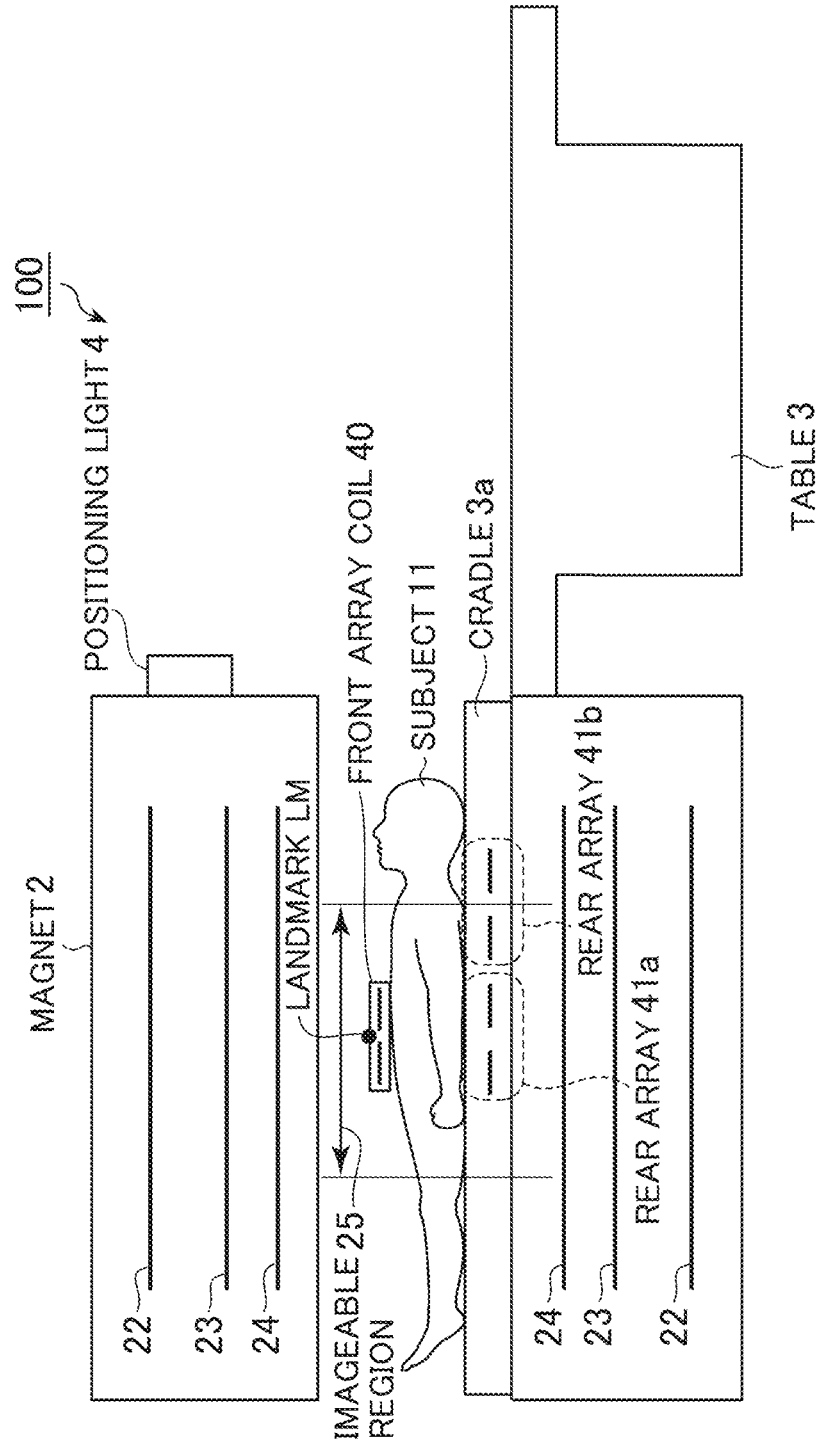
FIG. 9 is a diagram showing a state after the part to be imaged has been conveyed into an imageable region.

The operator moves the cradle 3a such that the abdomen of the subject is conveyed into the imageable region 25 in the bore 21 after the landmark LM has been set. The imageable region 25 indicates a region in which the static magnetic field exhibits favorable uniformity and the gradient magnetic field exhibits favorable linearity, and an image of good quality can be acquired. The imageable region 25 can be defined, for example, by setting an isocenter indicating the center of the gradient magnetic field as a reference. A state after the part to be imaged has been conveyed into the imageable region 25 is shown in FIG. 9. After the part to be imaged has been conveyed into the imageable region 25 in the bore 21, the flow proceeds to step ST3.

In step ST3, the scan A for coverage data (see FIG. 4) is performed to select candidates for coil modes to be used in the localizer scan LS and the main scan MS1 from within the coil modes Set1 to Set4. In description of the step ST3, the scan A for coverage data will be described first.

Figure 10:
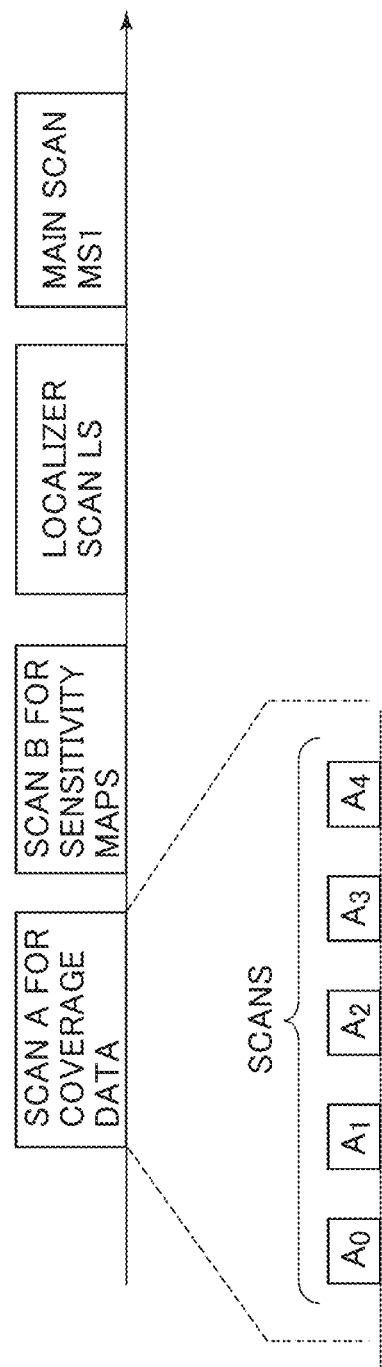
FIG. 10 is a diagram showing one example of a scan A.

FIG. 10 is a diagram showing one example of the scan A for coverage data.

In the exemplary embodiment, the scan A for coverage data has five scans $A_0$ to $A_4$. In the following, the scans $A_0$ to $A_4$ will be described.

Figure 11:
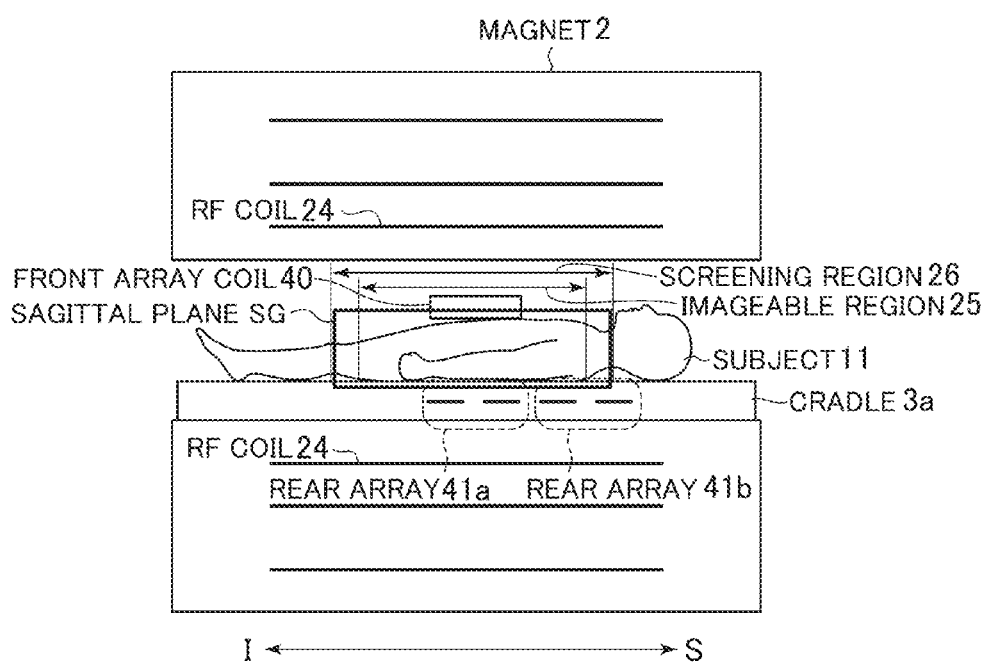
FIG. 11 is an explanatory diagram of scans $A_0$ to $A_4$.

FIG. 11 is an explanatory diagram of the scans $A_0$ to $A_4$.

Figure 12:
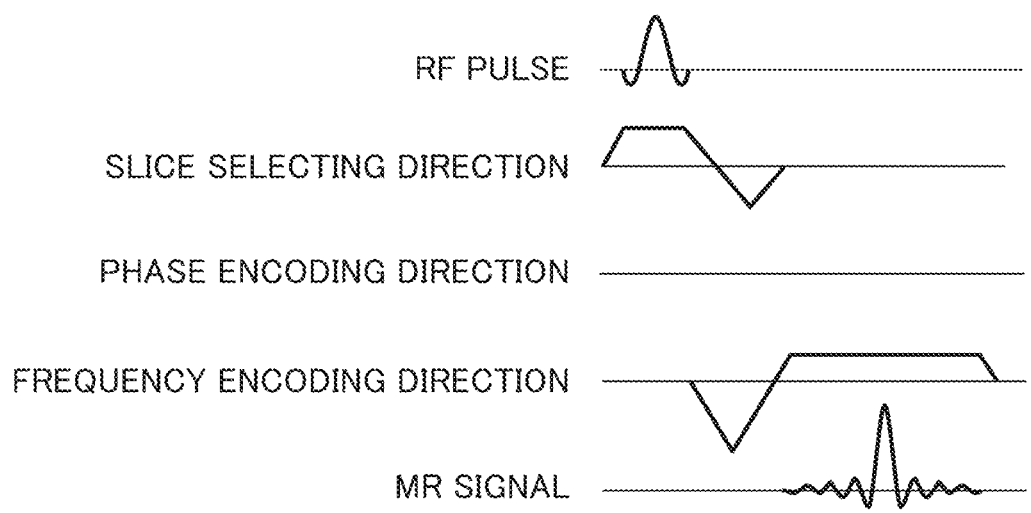
FIG. 12 is a diagram showing one example of a pulse sequence used in the scans $A_0$ to $A_4$.

The scans $A_0$ to $A_4$ are scans in which although the gradient magnetic field is applied to a sagittal plane SG within a screening region 26 in a frequency encoding direction (in FIG. 11, an SI (superior-inferior) direction), the gradient magnetic field is not applied in a phase encoding direction. One example of a pulse sequence used in the scans $A_0$ to $A_4$ is shown in FIG. 12. The screening region 26 is set to be wider than the imageable region 25. The length of the screening region 26 is 1.5 times the length of the imageable region 26. Incidentally, coils used to receive a magnetic resonance signal on the sagittal plane SG are different from one another in the scans $A_0$ to $A_4$. The coils to be used for receiving the magnetic resonance signal on the sagittal plane SG in the scans $A_0$ to $A_4$ are as follows.

(0) The scan $A_0$: the RF coil 24
(1) The scan $A_1$: the coil mode Set1 (the front array coil 40+the rear array 41a)
(2) The scan $A_2$: the coil mode Set2 (the front array coil 40+the rear array 41b)
(3) The scan $A_3$: the coil mode Set3 (the rear array 41a)
(4) The scan $A_4$: the coil mode Set4 (the rear array 41b)

In step ST3, the above mentioned scans $A_0$ to $A_4$ are executed to select the candidates for the coil modes to be used in the localizer scan LS and the main scan MS1 from within the coil modes Set1 to Set4 on the basis of data obtained by the respective scans $A_0$ to $A_4$. In the following, respective sub-steps ST31 to ST34 executed in step ST3 will be described in order.

Figure 13:
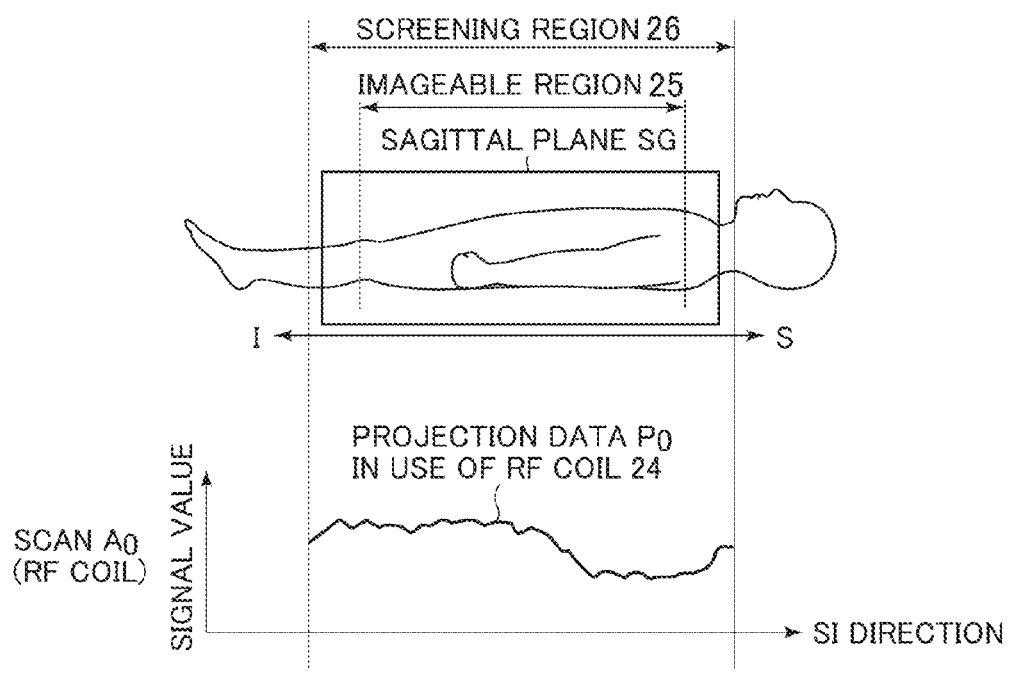
FIG. 13 is a diagram schematically showing projection data $P_0$ of an RF coil.

In sub-step ST31, the scan $A_0$ is executed using the RF coil 24. The magnetic resonance signal received by the RF coil is sent to the control unit 8 via the receiver 7. In the control unit 8, the data preparing unit 81 (see FIG. 1) prepares projection data when the RF coil 34 has been used on the basis of data obtained by the scan $A_0$. Projection data P0 when the RF coil 24 has been used is schematically shown in FIG. 13. Since the scan $A_0$ is a scan that although the gradient magnetic field is applied to the sagittal plane SG within the screening region 26 in the frequency encoding direction (the SI direction), the gradient magnetic field is not applied in the phase encoding direction, the projection data $P_0$ indicating data which has been projected in the phase encoding direction is obtained by executing the scan $A_0$. Since the frequency direction is the SI direction, the projection data $P_0$ indicates a relation between a position in the SI direction and a signal value. After the scan $A_0$ has been executed, the flow proceeds to sub-step ST32.

Figure 14:
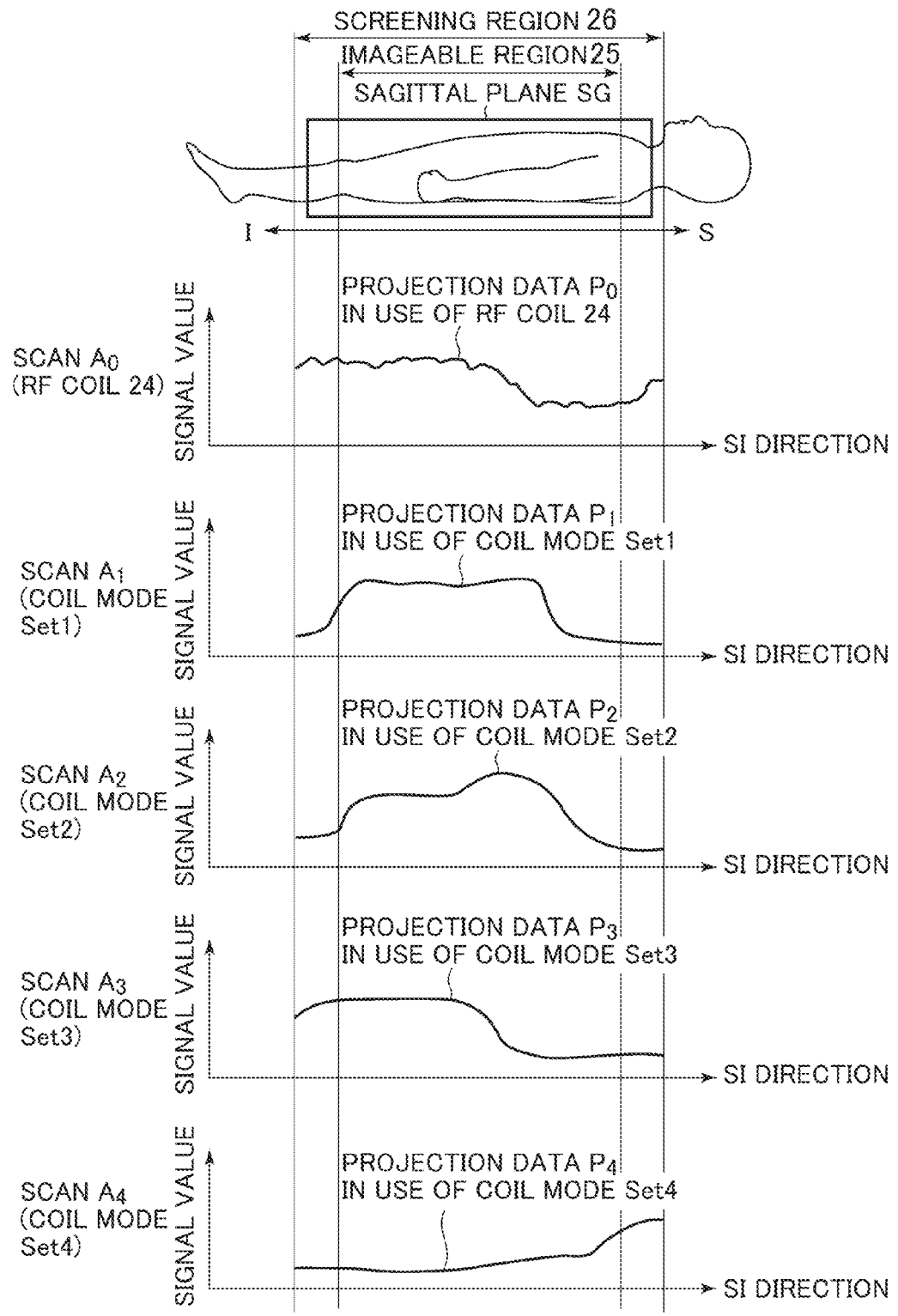
FIG. 14 is a diagram schematically showing projection data $P_1$ to $P_4$ prepared for respective coil modes Set1 to Set4.

In sub-step ST32, the scans $A_1$ to $A_4$ using the coil modes Set1 to Set4 are executed. The data preparing unit 81 prepares projection data when the coil modes Set1 to Set4 have been used on the basis of data obtained by the scans $A_1$ to $A_4$. Projection data $P_1$ to $P_4$ when the coil modes Set1 to Set4 have been used are schematically shown in FIG. 14. Since the scans $A_1$ to $A_4$ are scans that although the gradient magnetic field is applied to the sagittal plane SG within the screening region 26 in the frequency encoding direction (the SI direction), the gradient magnetic field is not applied in the phase encoding direction, the projection data $P_1$ to $P_4$ indicating the data projected in the phase encoding direction are obtained by executing the scans $A_1$ to $A_4$. Since the frequency encoding direction is the SI direction, the projection data $P_1$ to $P_4$ each indicate a relation between a position in the SI direction and a signal value. After the scans $A_1$ to $A_4$ have been executed, the flow proceeds to sub-step ST33.

In sub-step ST33, the data preparing unit 81 prepares sensitivity data (hereinafter, referred to as "coverage data") indicating sensitivities of the coil modes Set1 to Set4 in the SI direction (see FIG. 15).

Figure 15:
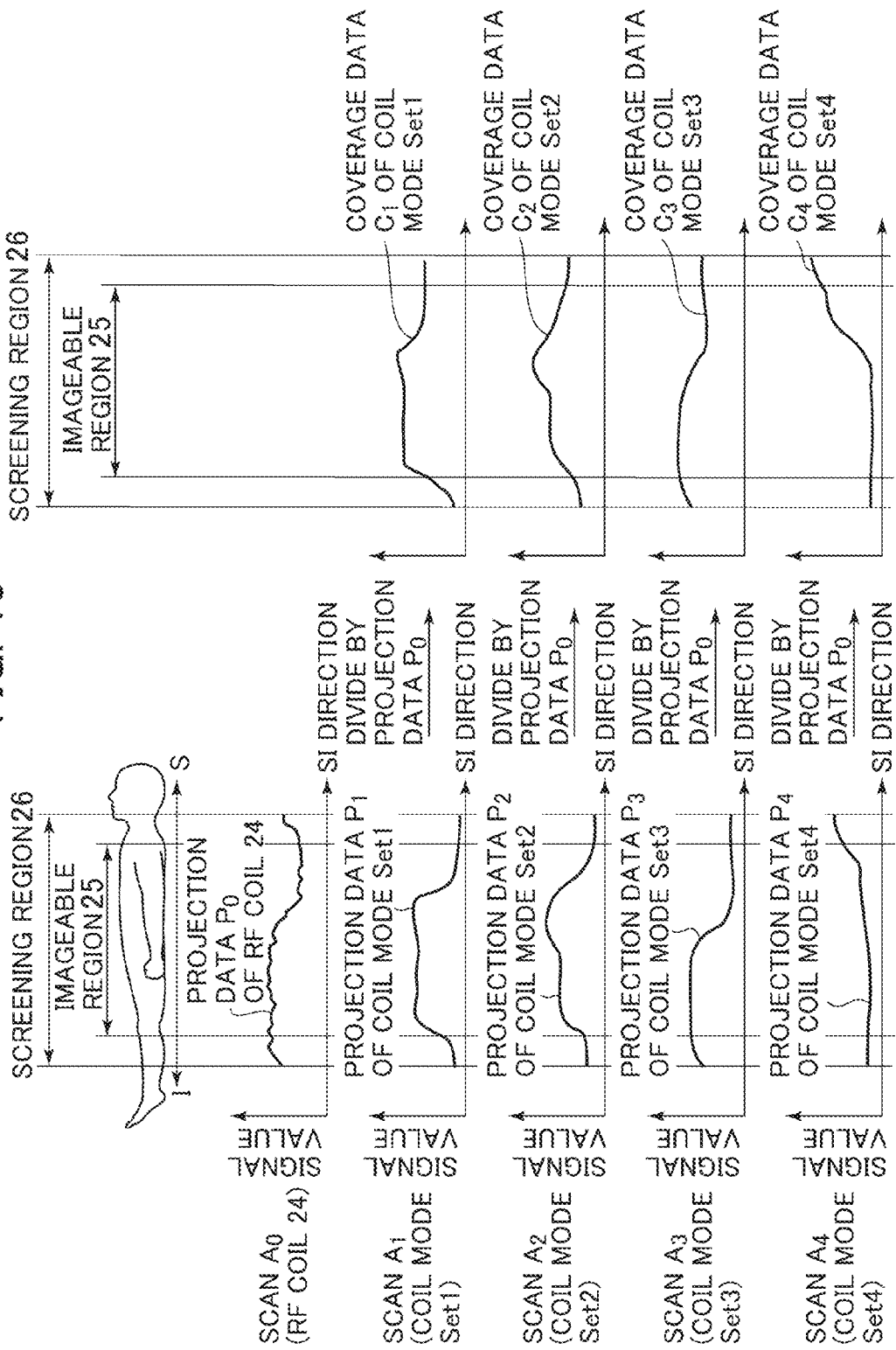
FIG. 15 is an explanatory diagram when coverage data are prepared.

FIG. 15 is an explanatory diagram when the coverage data are prepared.

The data preparing unit 81 prepares coverage data $C_1$ to $C_4$ by dividing respective signal values of the projection data $P_1$ to $P_4$ when the coil modes Set1 to Set4 have been used by the signal value of the projection data $P_0$ when the RF coil 24 has been used. Since the sensitivity of the RF coil 24 can be regarded to be uniform within the imageable region 25, the influence of a difference among the signal values caused by a difference among the human tissues can be reduced by dividing the signal values of the projection data $P_1$ to $P_4$ by the signal value of the projection data $P_0$. After the coverage data C1 to C4 have been prepared, the flow proceeds to sub-step ST34.

In sub-step ST34, a coil mode candidate selecting unit 82 (see FIG. 1) selects a coil mode having a high sensitivity in the imageable region 25 from within the coil modes Set1 to Set4 on the basis of the coverage data $C_1$ to $C_4$.

Figure 16:
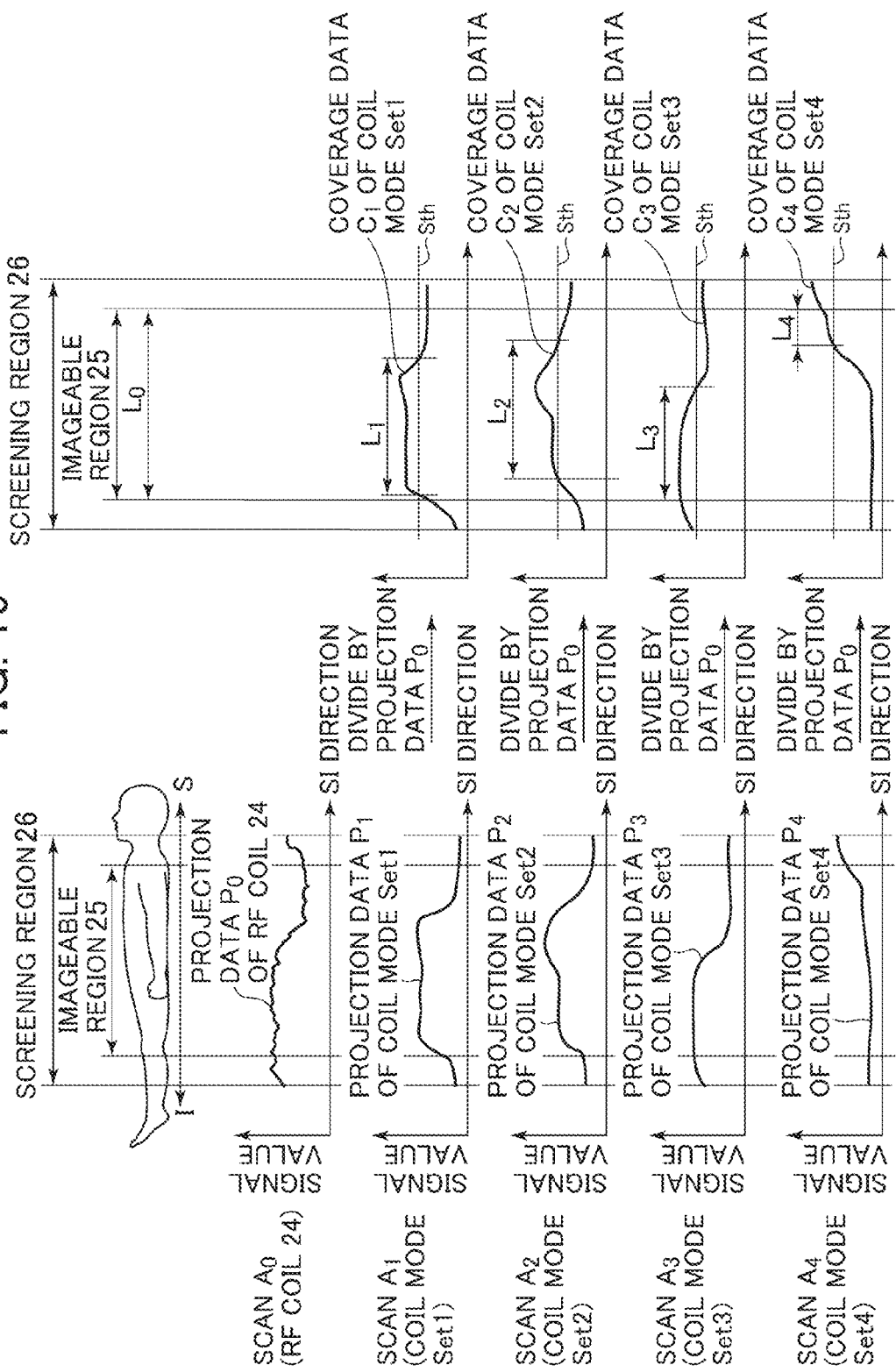
FIG. 16 is an explanatory diagram when a coil mode having a high sensitivity in the imageable region is detected from within the coil modes Set1 to Set4.

FIG. 16 is an explanatory diagram of one example when the coil mode having the high sensitivity within the imageable region 25 is selected.

In the exemplary embodiment, first, a range in which a signal value becomes larger than a threshold value $S_{th}$ is detected from within the imageable region 25 for each of the coverage data $C_1$ to $C_4$ to calculate a length $L=L_1$ to $L_4$ of the detected range in the SI direction. Incidentally, the threshold value $S_{th}$ may be a fixed value which has been determined in advance or may be obtained on the basis of the signal values of the coverage data $C_1$ to $C_4$.

Next, whether the following relational expression is established between the length $L=L_1$ to $L_4$ and a length $L_0$ of the imageable region 25 in the SI direction is determined.

$$L \geq k \cdot L_0 \quad (1)$$

A coefficient k in the expression (1) is a value of 0<k<1, and for example, k=0.5. If the expression (1) is satisfied, the coil mode will be determined to have a high sensitivity within the imageable region 25. On the other hand, if the expression (1) is not satisfied, the coil mode will be determined not to have the high sensitivity within the imageable region 25.

Here, it is supposed that although $L_1$, $L_2$ and $L_3$ satisfy the expression (1), $L_4$ does not satisfy the expression (1). Thus, three coil modes Set1, Set2 and Set3 are selected as the coil modes having high sensitivities from within the coil modes Set1 to Set4. The coil modes Set1, Set2 and Set3 which have been so selected are selected as the candidates for the coil modes used in the localizer scan LS and the main scan MS1. After the coil modes Set1, Set2 and Set3 have been selected, the flow proceeds to step ST4.

In step ST4, the scan B for sensitivity maps (see FIG. 4) is performed to prepare the sensitivity maps of the coil modes Set1, Set2 and Set3 selected in step ST3 in the imageable region 25. In description of step ST4, first, the scan B for sensitivity maps will be described.

Figure 17:
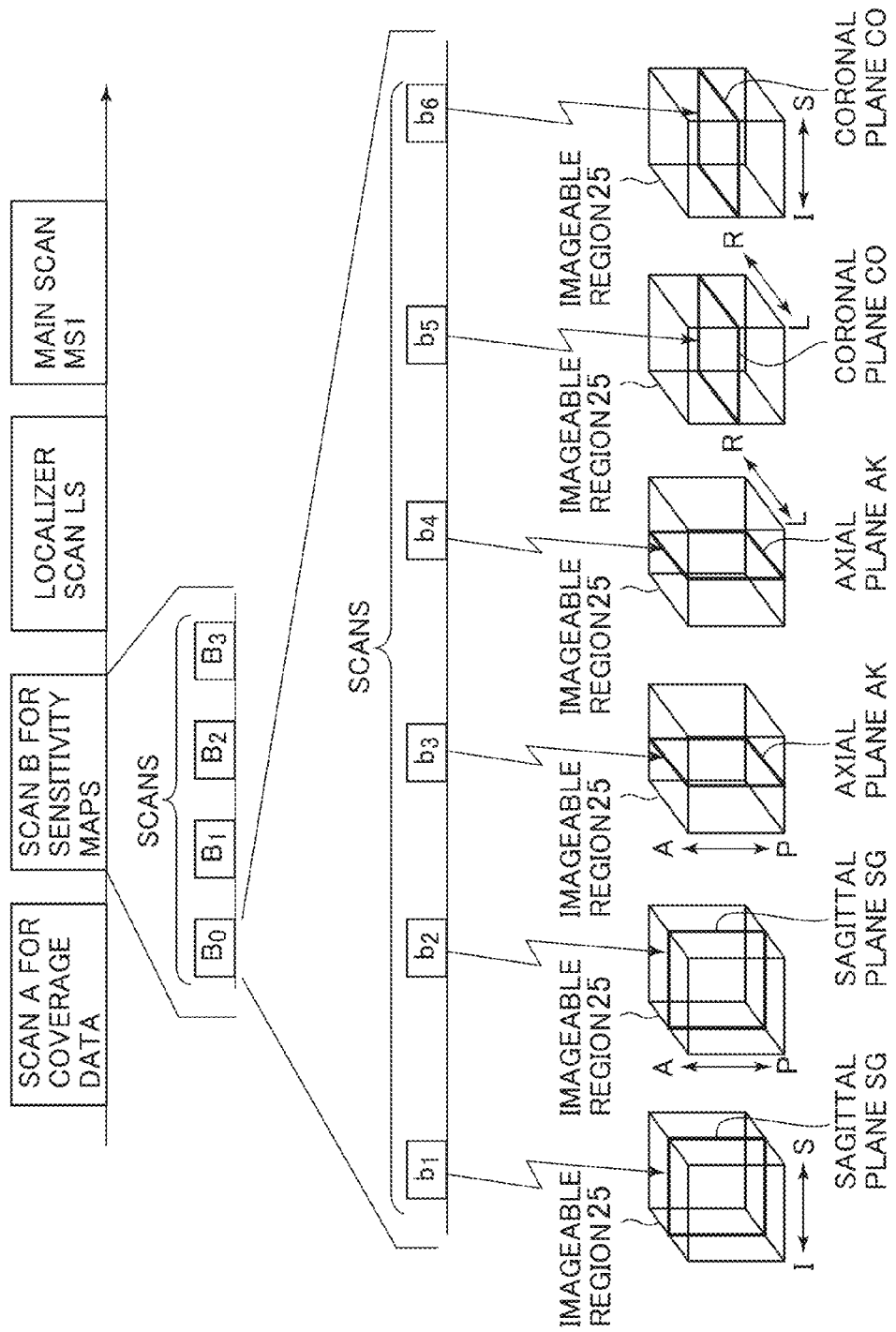
FIG. 17 is a diagram showing one example of a scan B.

FIG. 17 is a diagram showing one example of the scan B for sensitivity maps.

In the exemplary embodiment, the scan B for sensitivity maps has four scans $B_0$ to $B_3$. In the following, first, the scan $B_0$ will be described.

The scan $B_0$ includes six scans b1 to b6. The scans b1 to b6 are scans as described in the following.

(1) The scan b1: a scan that although the gradient magnetic field is applied to the sagittal plane SG within the imageable region 25 in the frequency encoding direction (the SI (superior-inferior) direction), the gradient magnetic field is not applied in the phase encoding direction (2) The scan b2: a scan that although the gradient magnetic field is applied to the sagittal plane SG within the imageable region 25 in a frequency encoding direction (an AP (anterior-posterior) direction), the gradient magnetic field is not applied in the phase encoding direction (3) The scan b3: a scan that although the gradient magnetic field is applied to an axial plane AK within the imageable region 25 in the frequency encoding direction (the AP direction), the gradient magnetic field is not applied in the phase encoding direction (4) The scan b4: a scan that although the gradient magnetic field is applied to the axial plane AK within the imageable region 25 in a frequency encoding direction (an RL (right-left) direction), the gradient magnetic field is not applied in the phase encoding direction (5) The scan b5: a scan that although the gradient magnetic field is applied to a coronal plane CO within the imageable region 25 in the frequency encoding direction (the RL direction), the gradient magnetic field is not applied in the phase encoding direction (6) The scan b6: a scan that although the gradient magnetic field is applied to the coronal plane CO within the imageable region 25 in the frequency encoding direction (the SI direction), the gradient magnetic field is not applied in the phase encoding direction That is, in the scan $B_0$, the six scans b1 to b6 are executed. As a pulse sequence in the scans b1 to b6, the same pulse sequence as that in FIG. 12 can be used. Incidentally, the above mentioned scans b1 to b6 are executed also in the scans $B_1$, $B_2$ and $B_3$ as in the scan $B_0$. However, the scans $B_0$ to $B_3$ are different from one another in coil used for receiving the magnetic resonance signal. In the scans $B_0$ to $B_3$, the coils used for receiving the magnetic resonance signal are as follows.

(0) The scan $B_0$: the RF coil 24
(1) The scan $B_1$: the coil mode Set1 (the front array coil 40+the rear array 41a)
(2) The scan $B_2$: the coil mode Set2 (the front array coil 40+the rear array 41b)
(3) The scan $B_3$: the coil mode Set3 (the rear array 41a)

In step ST4, the above mentioned scans $B_0$ to $B_3$ are executed to prepare the sensitivity maps of the coil modes Set1, Set2 and Set3 which have been selected in step ST3 on the basis of data obtained by the respective scans $B_0$ to $B_3$. In the following, respective sub-steps ST41 to ST43 executed in step ST4 will be described.

Figure 18:
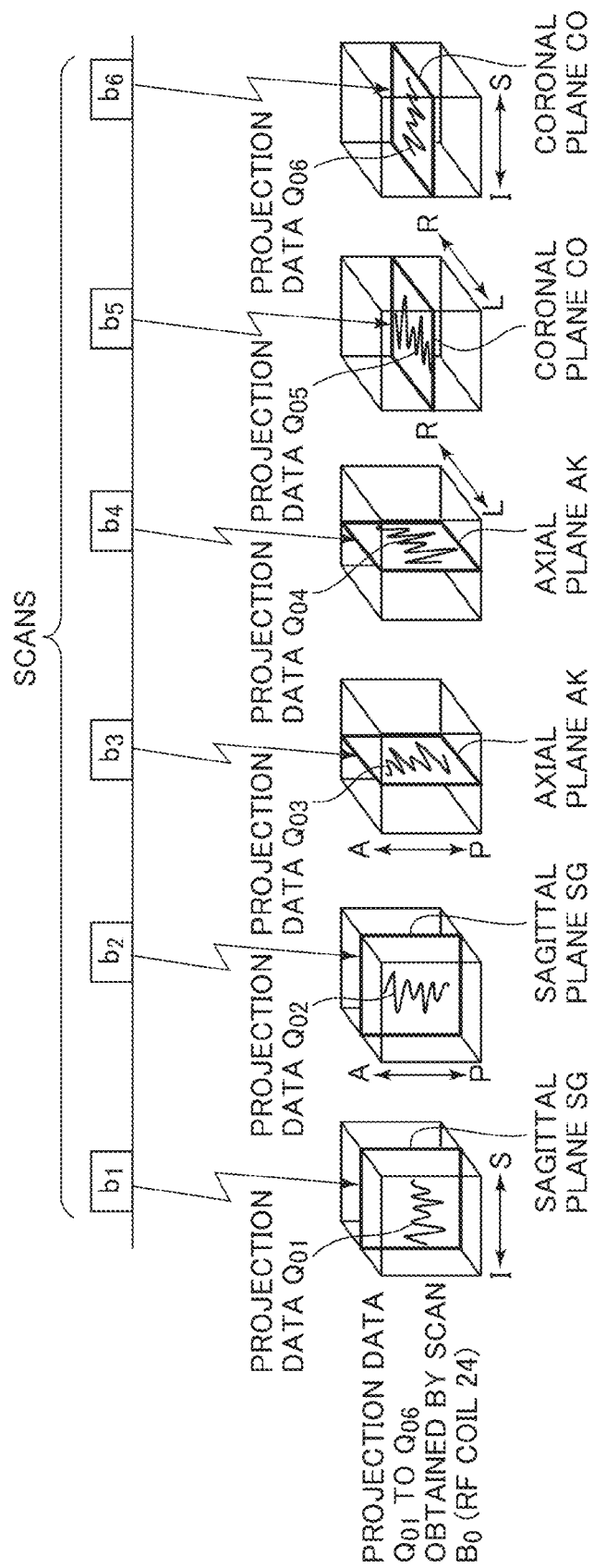
FIG. 18 is a diagram schematically showing prepared projection data $Q_{01}$ to $Q_{06}$.

In sub-step ST41, the scan $B_0$ (the scans b1 to b6) is executed using the RF coil 24. The magnetic resonance signal received by the RF coil 24 is sent to the control unit 8 via the receiver 7. In the control unit 8, the sensitivity map preparing unit 83 prepares projection data when the RF coil 24 has been used on the basis of data obtained by the scan $B_0$. Projection data $Q_{01}$ to $Q_{06}$ when the RF coil has been used are schematically shown in FIG. 18.

The projection data $Q_{01}$ indicates a relation between each position on the sagittal plane SG in the SI direction and a signal value. The projection data $Q_{02}$ indicates a relation between each position on the sagittal plane SG in the AP direction and a signal value.

The projection data $Q_{03}$ indicates a relation between each position on the axial plane AK in the AP direction and a signal value. The projection data $Q_{04}$ indicates a relation between each position on the axial plane AK in the RL direction and a signal value.

The projection data $Q_{05}$ indicates a relation between each position on the coronal plane CO in the RL direction and a signal value. The projection data $Q_{06}$ indicates a relation between each position on the coronal plane CO in the SI direction and a signal value.

After the scan $B_0$ has been executed, the flow proceeds to sub-step ST42.

Figure 19:
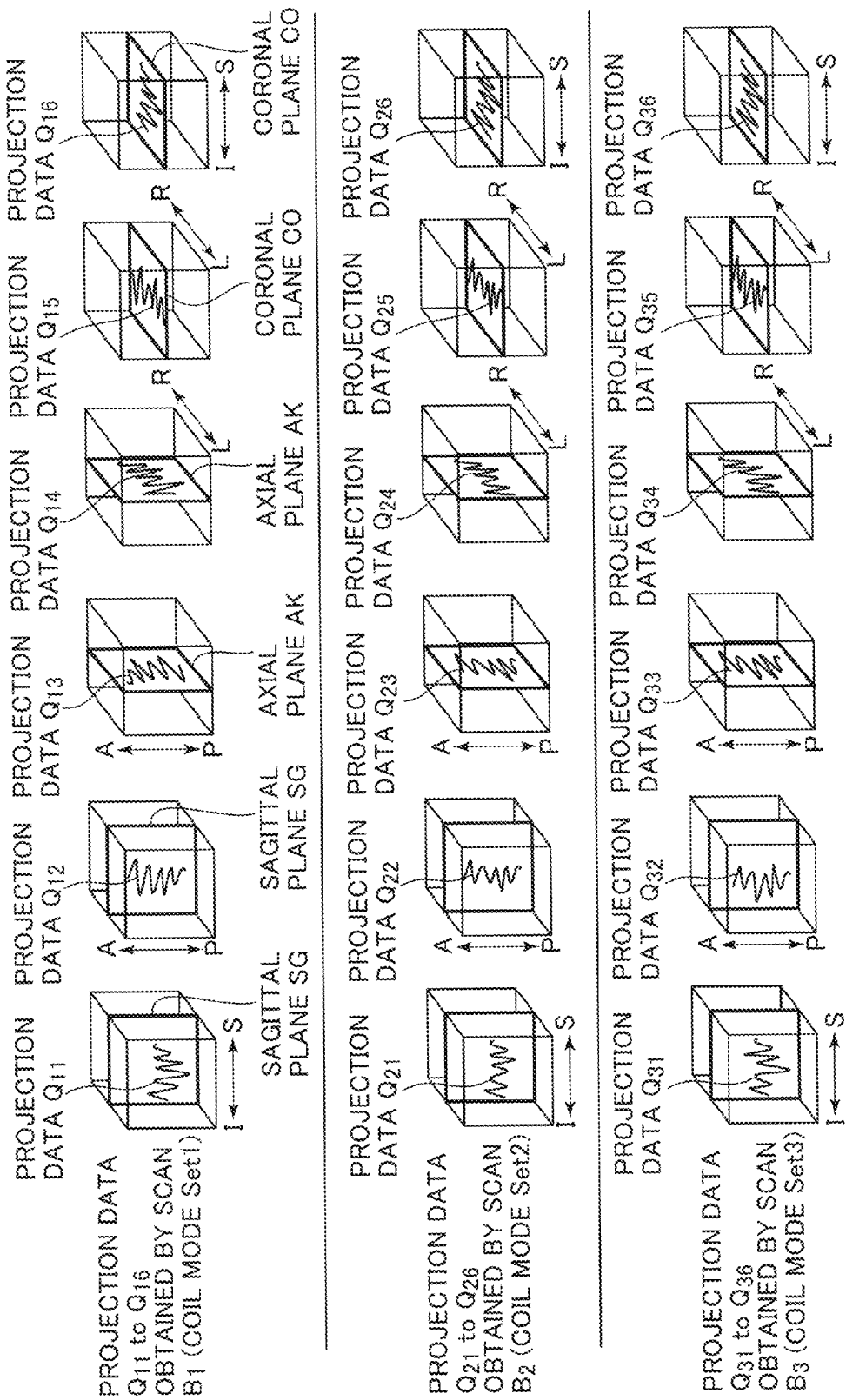
FIG. 19 is a diagram schematically showing projection data $Q_{11}$ to $Q_{16}$, $Q_{21}$ to $Q_{26}$, and $Q_{31}$ to $Q_{36}$ prepared for respective scans $B_1$ to $B_3$ for sensitivity maps.

In sub-step ST42, the scans $B_1$ to $B_3$ are executed. The scans b1 to b6 are executed also in the scans $B_1$ to $B_3$ as in the scan $B_0$. However, in the scans $B_1$ to $B_3$, the magnetic resonance signal is received respectively by using the coil modes Set1 to Set3. The magnetic resonance signals received by the coil modes Set1 to Set3 are sent to the control unit 8 via the receiver 7. In the control unit 8, the sensitivity map preparing unit 83 prepares projection data when the coil modes Set1 to Set3 have been used on the basis of data obtained by the scans $B_1$ to $B_3$. Projection data $Q_{11}$ to $Q_{16}$, $Q_{21}$ to $Q_{26}$, and $Q_{31}$ to $Q_{36}$ when the coil modes Set1 to Set3 have been used are schematically shown in FIG. 19.

After the scans $B_1$ to $B_3$ have been executed, the flow proceeds to sub-step ST43.

Figure 20:
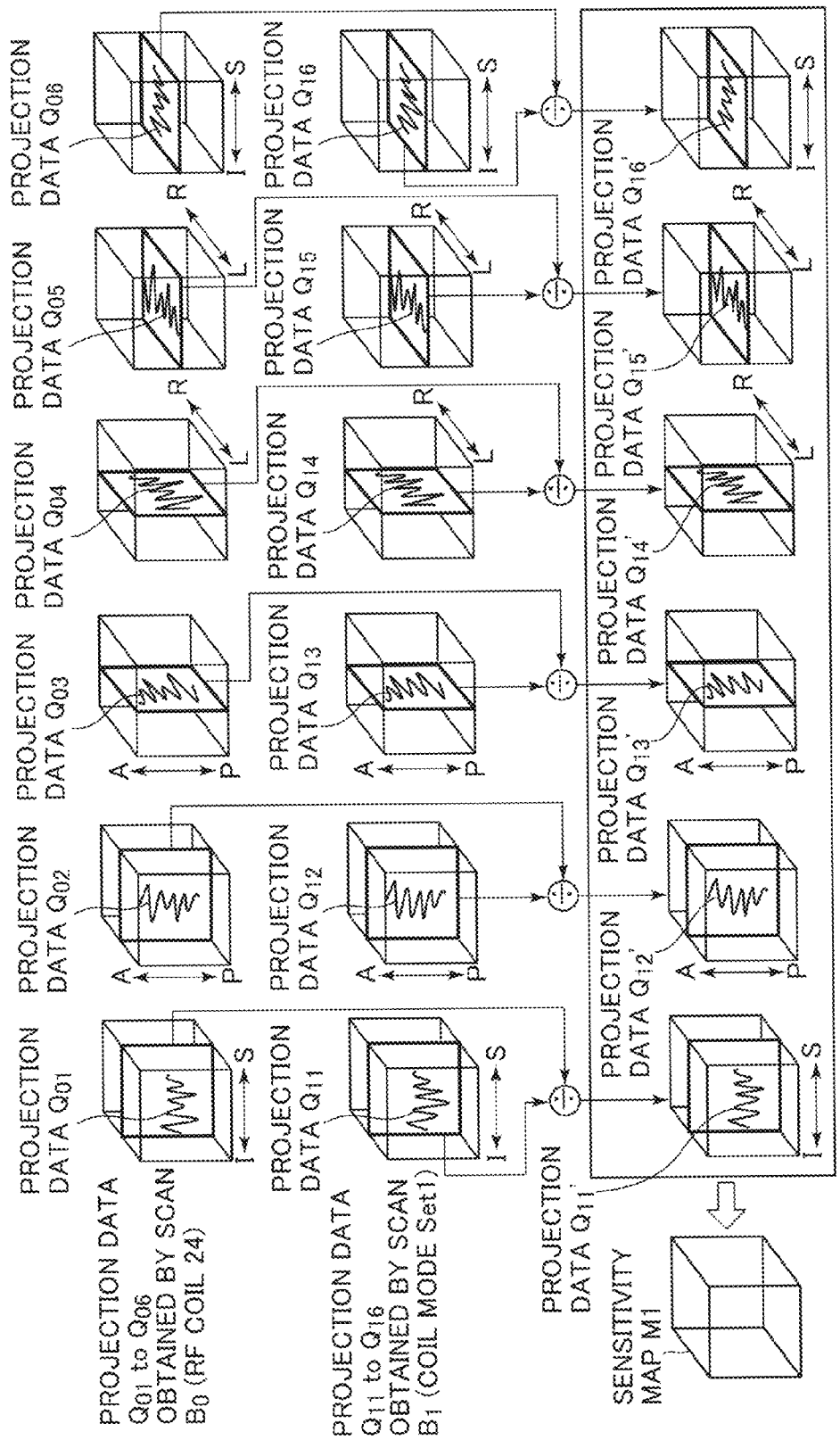
FIG. 20 is an explanatory diagram when a sensitivity map is prepared.

In sub-step ST43, the sensitivity map preparing unit 83 prepares sensitivity maps indicating sensitivities of the coil modes Set1 to Set3 in the imageable region 25 (see FIG. 20).

FIG. 20 is an explanatory diagram when the sensitivity maps are prepared. Incidentally, although in FIG. 20, a method of preparing the sensitivity map of the coil mode Set1 in the coil modes Set1-Set3 will be described representatively, the sensitivity maps of the other coil modes Set2 and Set3 can be also prepared by the method which will be described in the following.

First, the sensitivity map preparing unit 83 divides the signal values of the projection data $Q_{11}$ to $Q_{16}$ when the coil mode Set1 has been used by signal values of the projection data $Q_{01}$-$Q_{06}$ when the RF coil 24 has been used. Owing to this, the influence of the difference among the signal values caused by the difference among the human tissues can be reduced. In FIG. 20, the projection data $Q_{11}$ to $Q_{16}$ of the coil mode Set1 after divided by the projection data $Q_{01}$ to $Q_{06}$ of the RF coil 24 are designated by numerals "$Q_{11'}$" to "$Q_{16'}$".

Figure 21:
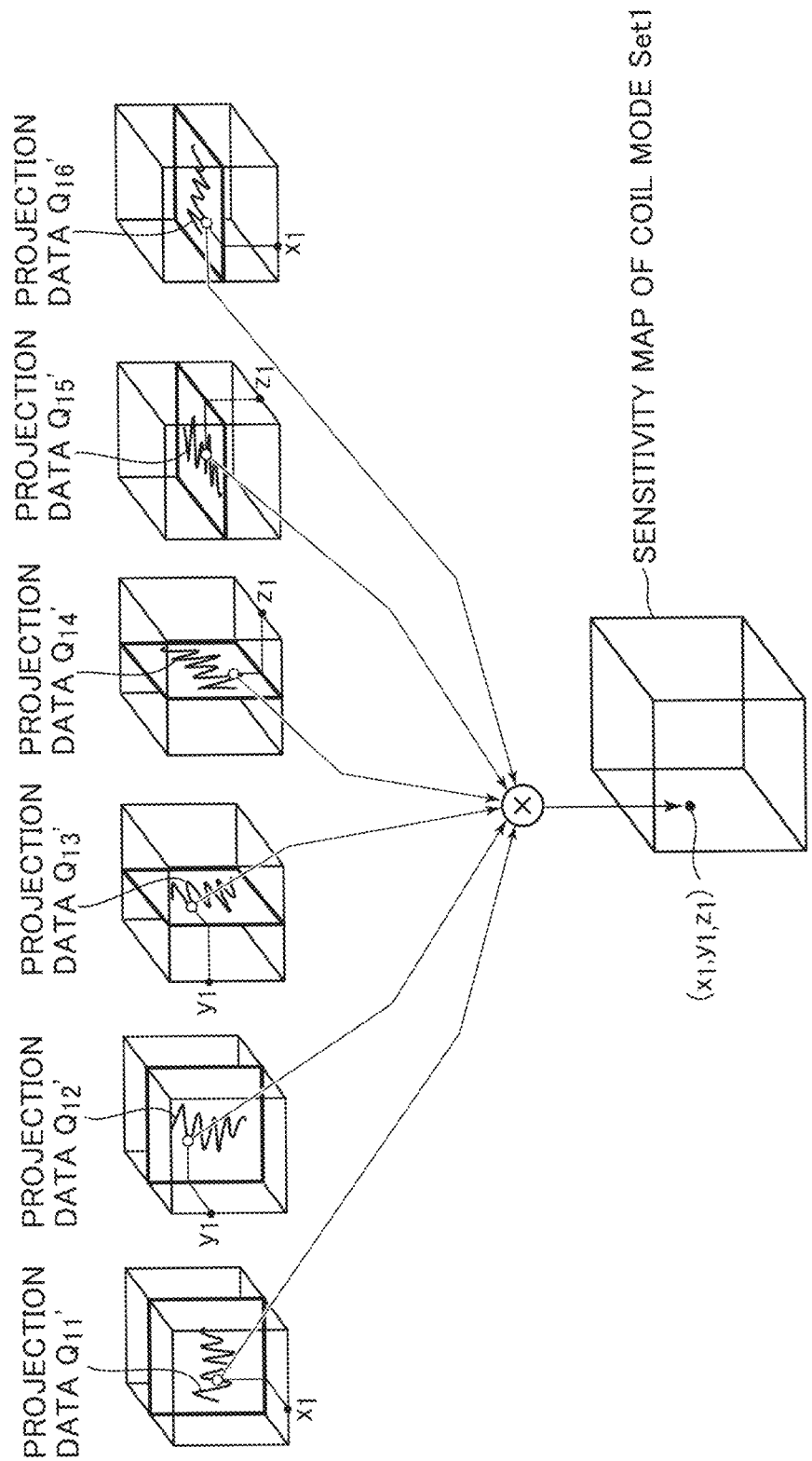
FIG. 21 is an explanatory diagram of one example of a method of preparing a sensitivity map $M_1$.

Next, the sensitivity map preparing unit 83 prepares a sensitivity map $M_1$ of the coil mode Set1 in the imageable region 25 on the basis of the obtained projection data $Q_{11'}$ to $Q_{16'}$ (see FIG. 21).

FIG. 21 is an explanatory diagram of one example of a method of preparing the sensitivity map $M_1$.

The sensitivity at a coordinate point $(x_1, y_1, z_1)$ of the sensitivity map $M_1$ is obtained by multiplying together signal values of respective coordinates $x_1$, $y_1$ and $z_1$ of the projection data $Q_{11'}$ to $Q_{16'}$, and is also obtained by multiplying together the signal values of the respective coordinates of the projection data $Q_{11'}$ to $Q_{16'}$ similarly with respect to other coordinate points.

The sensitivity map M1 of the coil mode Set1 in the imageable region 25 can be prepared from the projection data $Q_{11'}$ to $Q_{16'}$ in the above mentioned manner.

Figure 22:
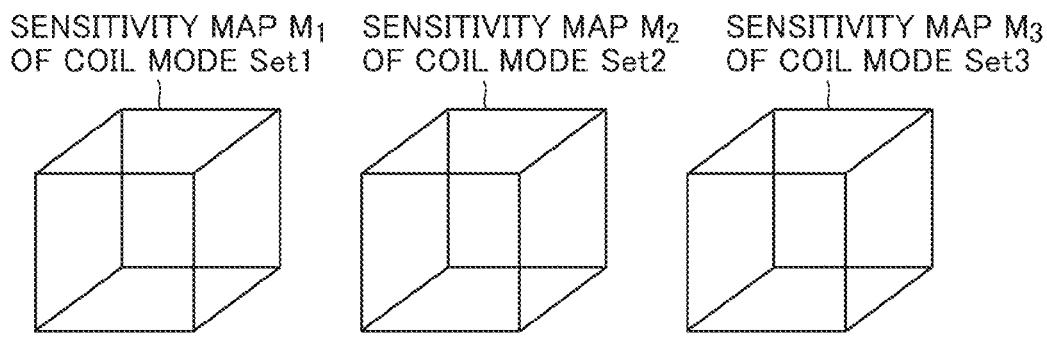
FIG. 22 is a diagram schematically showing sensitivity maps $M_1$ to $M_8$ of the coil modes Set1 to Set3.

Incidentally, sensitivity maps of the coil modes Set2 and Set3 can be also prepared in the same order. The sensitivity maps $M_1$ to $M_3$ of the coil modes Set1 to Set3 are schematically shown in FIG. 22. After the sensitivity maps $M_1$ to $M_3$ have been prepared, the flow proceeds to step ST5.

In step ST5, a coil mode which is considered to be the most suited for the localizer scan LS (see FIG. 4) is specified from within the coil modes Set1 to Set3 for which the sensitivity maps $M_1$ to $M_3$ have been prepared. In the following, respective sub-steps ST51 to ST54 of the step ST5 will be described.

Figure 23:
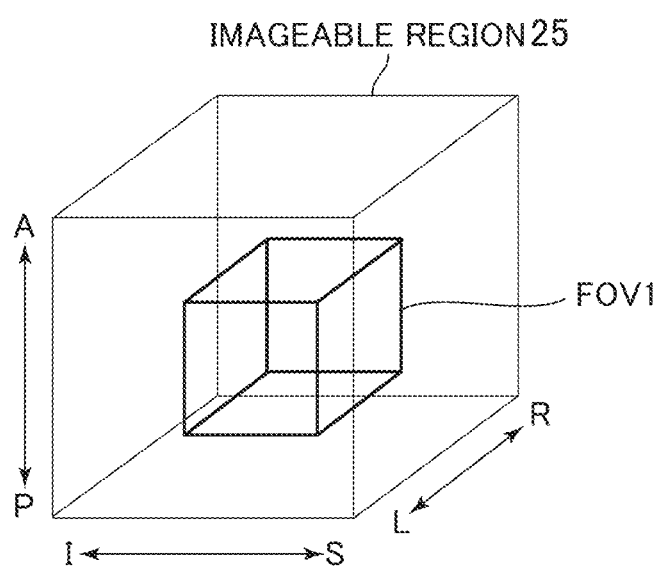
FIG. 23 is a diagram schematically showing one example of an imaging view field FOV1 which has been set within the imageable region.

In sub-step ST51, an imaging view field when the localizer scan LS is executed is set within the imageable region 25 (see FIG. 23).

FIG. 23 is a diagram schematically showing one example of an imaging view field FOV1 set within the imageable region 25.

The operator makes the display unit 10 display the sensitivity maps $M_1$ to $M_3$ prepared in step ST4. Then, FOV1 when the localizer scan LS is executed is set while referring to the sensitivity maps $M_1$ to $M_3$ displayed on the display unit 10. After FOV1 has been set, the flow proceeds to sub-step ST52. Incidentally, in the case that FOV1 when the localizer scan LS is executed is set in advance by default, sub-step ST51 is skipped and the flow proceeds to sub-step ST52.

Figure 24:
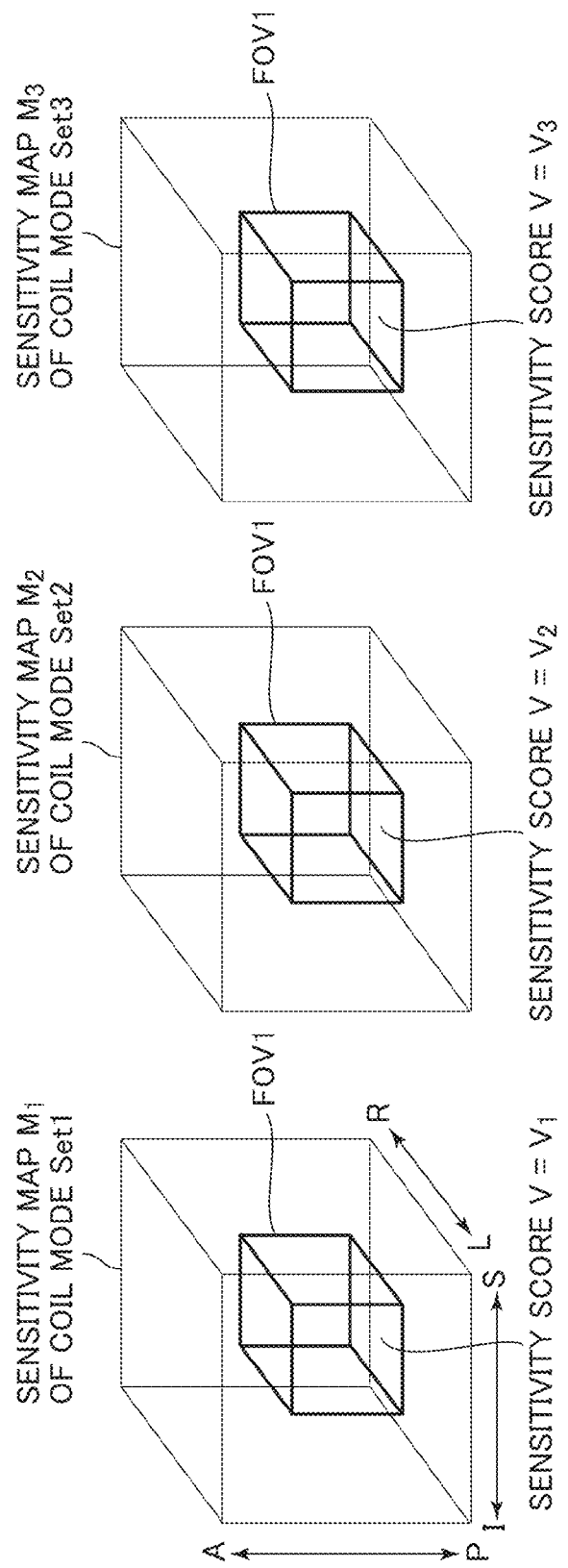
FIG. 24 is an explanatory diagram when sensitivity scores are calculated.

In sub-step ST52, the sensitivity score calculating unit (see FIG. 1) calculates a sensitivity score indicating a sensitivity in FOV1 for each of the sensitivity maps $M_1$ to $M_3$ of the coil modes Set1 to Set3 (see FIG. 24).

FIG. 24 is an explanatory diagram when the sensitivity score is calculated.

A sensitivity score V can be calculated, for example, as a mean value of sensitivities at respective positions in FOV1. In FIG. 24, the sensitivity scores V of the coil modes Set1, Set2 and Set3 are designated by $V_1$, $V_2$ and $V_3$. After the sensitivity scores have been calculated, the flow proceeds to step ST53.

In step ST53, a coil mode which is the largest in sensitivity score is obtained from within the coil modes Set1 to Set3. Here, it is supposed that $V_1$ has a maximum value in the sensitivity scores $V_1$, $V_2$ and $V_3$. Thus, the coil mode Set1 is selected. After the coil mode Set1 which is the largest in sensitivity score has been selected, the flow proceeds to sub-step ST54.

Figure 25:
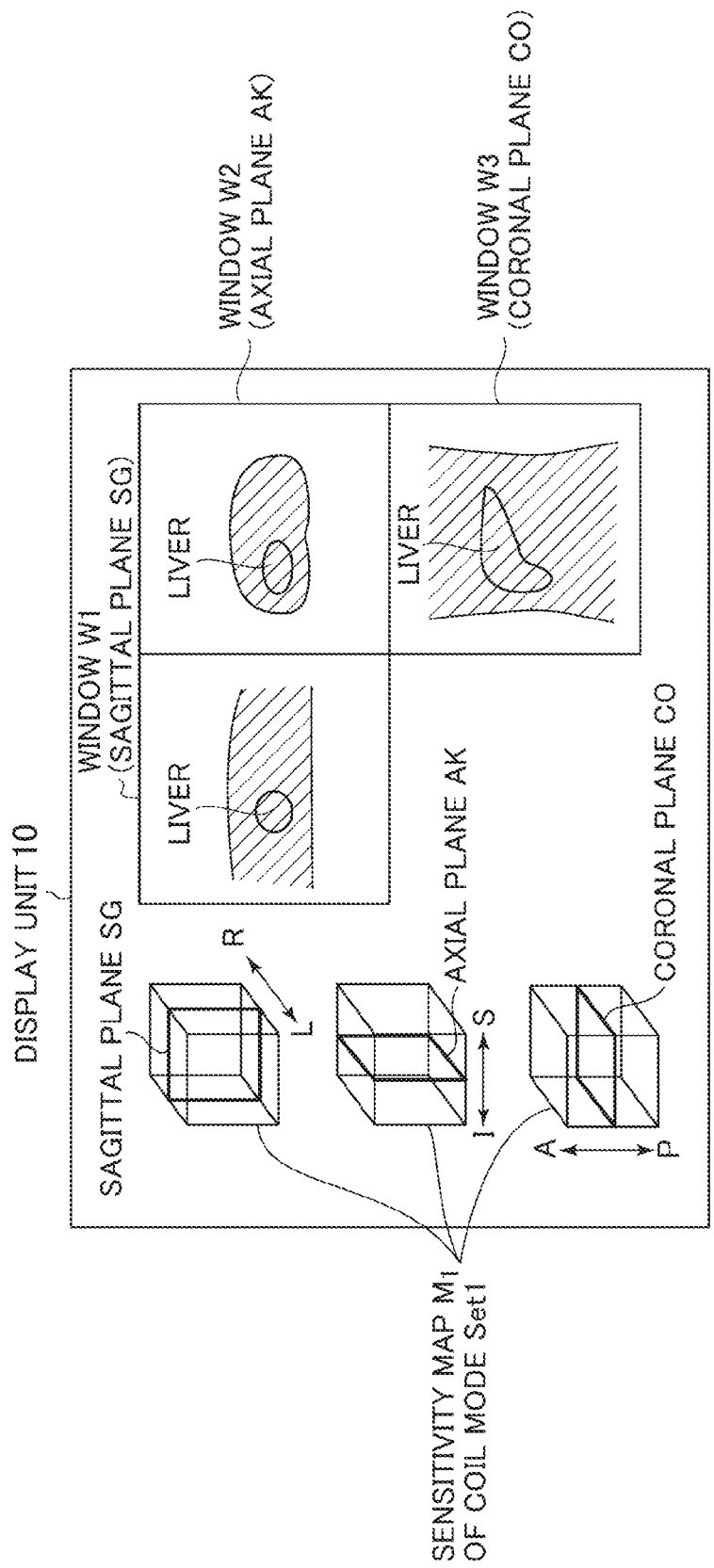
FIG. 25 is a diagram schematically showing the sensitivity map M1 of the coil mode Set1 which has been displayed on a display unit.

In sub-step ST54, the sensitivity map $M_1$ of the coil mode Set1 is displayed on the display unit 10 (see FIG. 25).

FIG. 25 is a diagram schematically showing the sensitivity map $M_1$ of the coil mode Set1 displayed on the display unit 10.

On the display unit 10, three windows W1, W2 and W3 and others are displayed.

The window W1 is a window for displaying a sensitivity distribution on the sagittal plane SG of the sensitivity map $M_1$. The window W2 is a window for displaying a sensitivity distribution on the axial plane AK of the sensitivity map $M_1$. The window W3 is a window for displaying a sensitivity distribution on the coronal plane CO of the sensitivity map $M_1$.

The operator can move the positions of the sagittal plane SG, the axial plane AK and the coronal plane CO of the sensitivity map $M_1$ respectively in the RL direction, the SI direction and the AP direction as required. Thus, the operator can visually confirm the sensitivity map $M_1$ of the coil mode Set1 within the imageable region 25 before executing the localizer scan LS by observing the sensitivity distributions of the respective windows W1, W2 and W3. Owing to this, the operator can confirm to which extent of sensitivity the coil mode Set1 has to the part to be imaged by the localizer scan LS.

In addition, the operator can make the display unit 10 display not only the sensitivity map $M_1$ of the coil mode Set1 but also the sensitivity map $M_2$ of the coil mode Set2 and the sensitivity map $M_3$ of the coil mode Set3 by operating the operation unit 9. Thus, the operator can recognize not only the sensitivity map $M_1$ of the coil mode Set1 but also the sensitivity map $M_2$ of the coil mode Set2 and the sensitivity map $M_3$ of the coil mode Set3.

The operator confirms the sensitivity map $M_1$ of the coil mode Set1 displayed on the display unit 10 and determines whether the localizer scan LS is to be executed by using the coil mode Set1. When it has been determined to execute the localizer scan LS by using the coil mode Set1, the operator operates the operation unit 9 to input an instruction for executing the localizer scan LS. When this instruction is input, the flow proceeds to step ST6 and the localizer scan LS using the coil mode Set1 is executed.

On the other hand, when the operator has thought that execution of the localizer scan LS by using a coil mode other than the coil mode Set1 would be desirable, the operator operates the operation unit 9 to input an instruction for changing the coil mode. For example, when it has been thought that execution of the localizer scan LS using the coil mode Set2 would be desirable, the operation unit 9 is operated to input an instruction for changing the coil mode from Set1 to Set2. After the instruction for changing the coil mode has been input, an instruction for executing the localizer scan LS is input. When this instruction is input, the flow proceeds to step ST6 and the localizer scan LS using the coil mode Set2 is executed.

Figure 26:
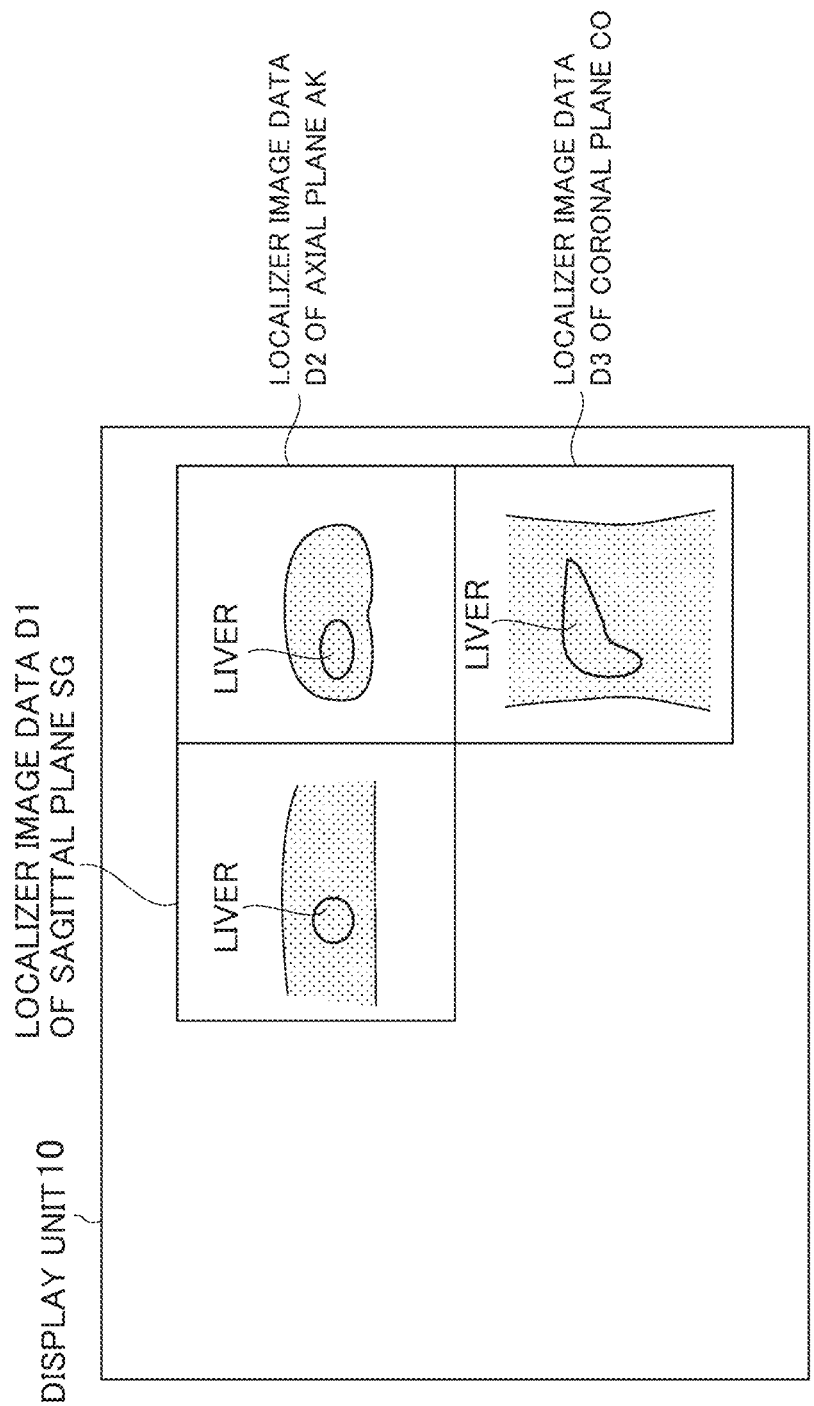
FIG. 26 is a diagram schematically showing localizer image data obtained by a localizer scan.

Here, it is supposed that the operator has determined to execute the localizer scan LS using the coil mode Set1. Thus, the localizer scan LS using the coil mode Set1 is executed in step ST6. Localizer image data obtained by the localizer scan is schematically shown in FIG. 26. In the exemplary embodiment, localizer image data D1 on the sagittal plane SG, localizer image data D2 on the axial plane AK and localizer image data D3 on the coronal plane CO are acquired. After execution of the localizer scan LS, the flow proceeds to step ST7.

In step ST7, a coil mode which is thought to be the most suited for the main scan MS1 (see FIG. 4) is selected from within the coil modes Set1 to Set3 for which the sensitivity maps $M_1$ to $M_3$ have been prepared. In the following, respective sub-steps ST71 to ST74 in the step ST7 will be described.

Figure 27:
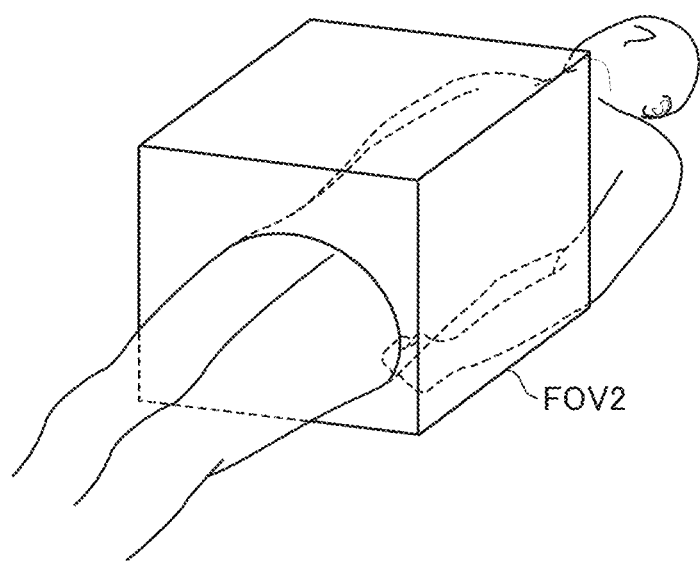
FIG. 27 is a diagram schematically showing one example of an imaging view field FOV2 which has been set.

In sub-step ST71, an imaging view field when the main scan MS1 is to be executed is set (see FIG. 27).

FIG. 27 is a diagram schematically showing one example of an imaging view field FOV2 which has been set.

The operator sets a slice position and the imaging view field FOV2 when the main scan MS1 is to be executed while referring to the localizer image data acquired in step ST6. After FOV2 has been set, the flow proceeds to sub-step ST72.

Figure 28:
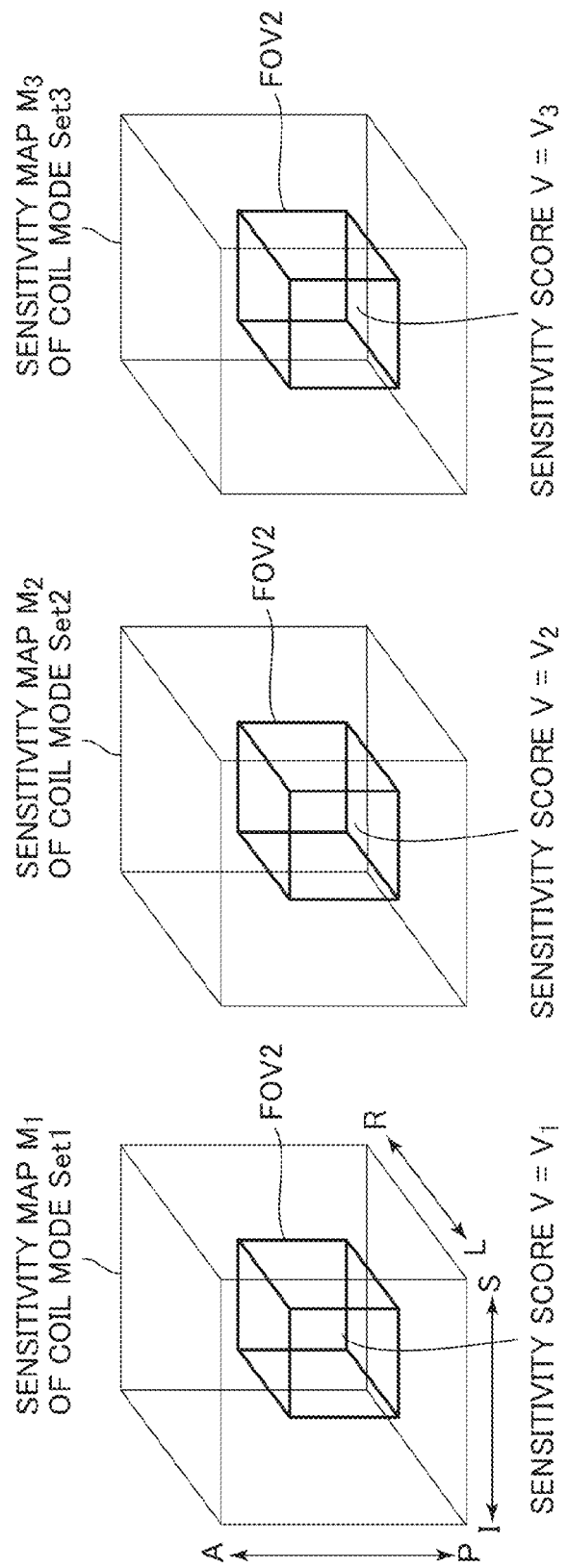
FIG. 28 is a diagram showing sensitivity scores V.

In sub-step ST72, the sensitivity score calculating unit 84 calculates the sensitivity score indicating the sensitivity in FOV2 for each of the sensitivity maps $M_1$ to $M_3$ of the coil modes Set1 to Set3. The sensitivity score V is shown in FIG. 28. Incidentally, since the method of calculating the sensitivity score is the same as the method in sub-step ST52 (see FIG. 24), description thereof will be omitted.

In sub-step ST73, a coil mode which is the largest in sensitivity score is obtained from within the coil modes Set1 to Set3. Here, it is supposed that $V_2$ has a maximum value in the sensitivity scores $V_1$, $V_2$ and $V_3$. Thus, the coil mode Set2 is selected. After selection of the coil mode Set2 which is the largest in sensitivity score V, the flow proceeds to sub-step ST74.

Figure 29:
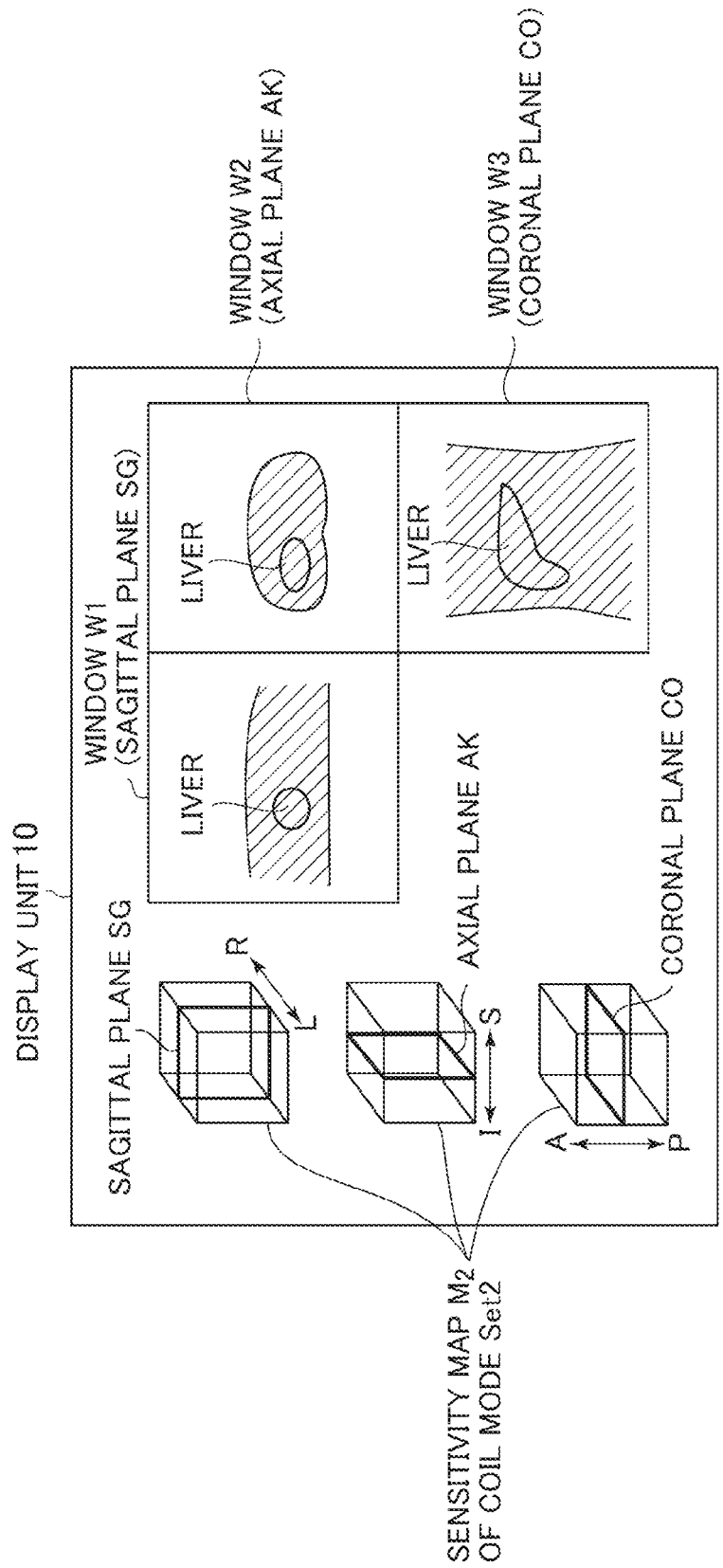
FIG. 29 is a diagram schematically showing the sensitivity map M2 of the coil mode Set2 which has been displayed on the display unit.

In step ST74, the sensitivity map $M_2$ of the coil mode Set2 is displayed on the display unit 10 (see FIG. 29).

FIG. 29 is a diagram schematically showing the sensitivity map $M_2$ of the coil mode Set2 which has been displayed on the display unit 10.

The three windows W1, W2 and W3 and others are displayed on the display unit 10.

The window W1 is a widow for displaying the sensitivity distribution on the sagittal plane SG of the sensitivity map $M_2$. The window W2 is a window for displaying the sensitivity distribution on the axial plane AK of the sensitivity map $M_2$. The window W3 is a window for displaying the sensitivity distribution on the coronal plane CO of the sensitivity map $M_2$.

The operator can move the positions of the sagittal plane SG, the axial plane AK and coronal plane CO of the sensitivity map $M_2$ respectively in the RL direction, the SI direction and the AP direction as required. Thus, the operator can visually confirm the sensitivity map $M_2$ of the coil mode Set2 before executing the main scan MS1 by observing the sensitivity distributions in the respective windows W1, W2 and W3. Owing to this, the operator can confirm to which extent of sensitivity the coil mode Set2 has to the part to be imaged before executing the main scan MS1.

Figure 30:
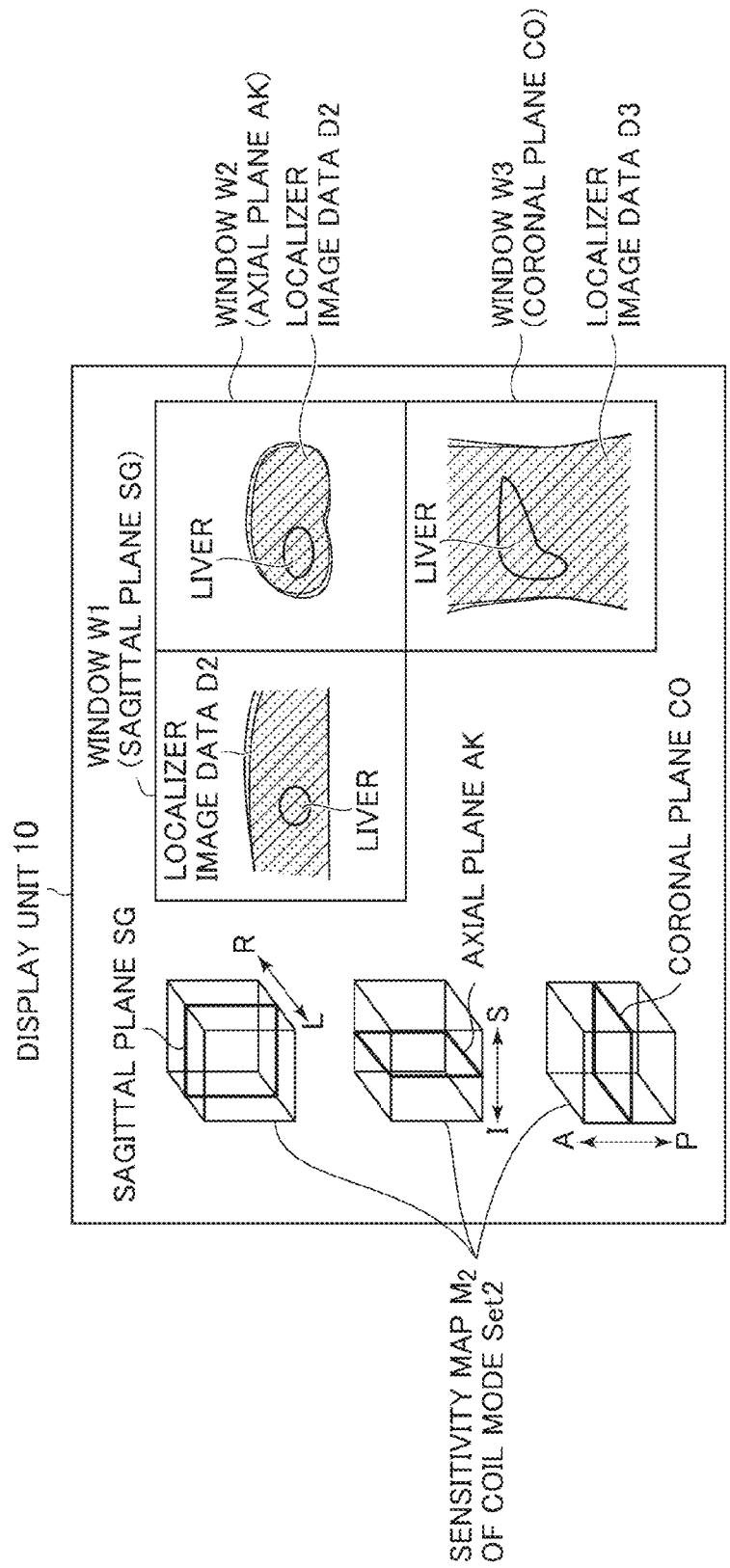
FIG. 30 is a diagram schematically showing a state that localizer image data are superimposed on sensitivity distributions in windows.

Incidentally, the operator may display the localizer image data (see FIG. 26) acquired in step ST6 by superimposing them on the sensitivity distributions in the windows W1, W2 and W3 on the display unit 10 (see FIG. 30).

FIG. 30 is a diagram schematically showing a state that the localizer image data are superimposed on the sensitivity distributions in the windows.

A corresponding relation between the localizer image data and the sensitivity distribution can be visually recognized by superimposing the localizer image data on the sensitivity distribution in the window. Thus, the operator can know in more detail the relation between the part which is being displayed in the localizer image data and the sensitivity.

In addition, the operator can make the display unit 10 display not only the sensitivity map $M_2$ of the coil mode Set2 but also the sensitivity map $M_1$ of the coil mode Set1 and the sensitivity map $M_3$ of the coil mode Set3 by operating the operation unit 9. Thus, the operator can confirm not only the sensitivity map $M_2$ of the coil mode Set2 but also the sensitivity map $M_1$ of the coil mode Set1 and the sensitivity map $M_3$ of the coil mode Set3.

The operator confirms the sensitivity map $M_2$ of the coil mode Set2 which is being displayed on the display unit 10 and determines whether the main scan MS1 is to be executed by using the coil mode Set2. When it has been determined to execute the main scan MS1 by using the coil mode Set2, the operator operates the operation unit 9 to input an instruction for executing the main scan MS1. When this instruction is input, the flow proceeds to step ST8 and the main scan MS1 using the coil mode Set2 is executed.

On the other hand, when the operator has thought that execution of the main scan MS1 by using a coil mode other than the coil mode Set2 would be desirable, the operation unit 9 is operated to input an instruction for changing the coil mode. For example, when it has been thought that execution of the main scan MS1 using the coil mode Set1 would be desirable, the operation unit 9 is operated to input an instruction for changing the coil mode from Set2 to Set1. After the instruction for changing the coil mode has been input, an instruction for executing the main scan MS1 is input. When this instruction is input, the flow proceeds to step ST8 and the main scan MS1 using the coil mode Set1 is executed, by which the flow comes to an end.

In the exemplary embodiment, before execution of the localizer scan LS, the coil modes Set1 to Set3 which are large in sensitivity in the SI direction are selected from within the coil modes Set1 to Set4 (sub-step ST34). Then, the sensitivity maps of the coil modes Set1-Set3 are prepared to obtain the coil mode Set1 which is maximized in sensitivity score within FOV1 of the localizer scan LS from within the coil modes Set1-Set3. Thus, it becomes possible to automatically detect the coil mode Set1 which is suited for the localizer scan LS. In addition, since the sensitivity map of the coil mode Set1 is displayed on the display unit 10, the operator can visually confirm to which extent of sensitivity the coil mode Set1 has to the part to be imaged by the localizer scan LS before execution of the localizer scan LS. Further, the operator can display also the sensitivity maps of the coil modes Set2 and Set3 other than the coil mode Set1 on the display unit 10 and hence can visually confirm also the sensitivity maps of the coil mode Set1 and Set3. Thus, the operator can compare the sensitivity maps of the coil modes Set1-Set3 with one another before execution of the localizer scan LS. In addition, when the operator has thought that execution of the localizer scan LS not using the coil mode Set1 but using another coil mode (for example, Set2) would be better, the operator can change the coil mode of his own will, so that execution of the localizer scan LS that the operator would desire becomes possible.

In addition, in the scan A for coverage data and the scan B for sensitivity maps, scans that a phase encoding amount is not changed are executed. Thus, a scan time taken for the scan A for coverage data and a scan time taken for the scan B for sensitivity map can be reduced.

In addition, in the exemplary embodiment, the coil mode Set2 which is maximized in sensitivity score in FOV2 for the main scan MS1 is obtained from within the coil modes Set1-Set3 before execution of the main scan MS1. Thus, it becomes possible to automatically detect the coil mode Set2 which is suited for the main scan MS1. In addition, since the sensitivity map of the coil mode Set2 is displayed on the display unit 10, the operator can visually confirm to which extent of sensitivity the coil mode Set2 has to the part to be imaged by the main scan MS1 before execution of the main scan MS1. Further, the operator can display also the sensitivity maps of the coil modes Set1 and Set3 other than the coil mode Set2 on the display unit 10 and hence can visually confirm the sensitivity maps of the coil modes Set1 and Set3. Thus, the operator can also compare the sensitivity maps of the coil modes Set1-Set3 with one another before execution of the main scan. In addition, when the operator has thought that execution of the main scan MS1 not using the coil mode Set2 but using another coil mode (for example, Set1) would be better, the operator can change the coil mode of his own will, so that execution of the main scan MS1 that the operator would desire becomes possible.

Incidentally, when another main scan MS2 is to be executed after execution of the main scan MS1, step ST7 is executed to select a coil mode to be used in execution of another main scan MS2. Then, the main scan MS2 may be executed using the selected coil mode. However, when the position of a part to be imaged by the main scan MS2 is greatly separated from the position of the part which has been imaged by the main scan MS1, step ST7 may be executed to select a coil mode to be used in execution of the main scan MS2 after setting again the position of the landmark returning to step ST2 and then executing step ST3 and step ST4.

In the exemplary embodiment, the coil modes Set1, Set2 and Set3 which are large in sensitivity in the SI direction are selected as the candidates for the coil modes to be used in the localizer scan LS and the main scan MS1 (step ST3) before execution of the localizer scan LS. Thus, since exclusion of the coil mode Set4 which is small in sensitivity in the SI direction from the candidates for the coil modes to be used in the localizer scan LS and the main scan MS1 is possible, there is no need to perform a scan using the coil mode Set4 in step ST42, and it becomes possible to promote scan time reduction.

In addition, in the exemplary embodiment, the projection data are acquired from the mutually intersecting three planes (the sagittal plane SG, the axial plane AK and the coronal plane CO) to prepare the sensitivity maps. However, the sensitivity maps may be prepared by acquiring the projection data from three or more planes. Further, the sensitivity maps may be prepared by acquiring the projection data from a plurality of parallel-arrayed planes, in place of acquiring the projection data from a plurality of mutually intersecting planes.

Incidentally, it is described that the coil modes Set1-Set3 which are high in sensitivity in the SI direction can be distinguished from the coil mode Set4 which is low in sensitivity in the SI direction by the coverage data $C_1$-$C_4$ in step ST3. Thus, a simple experiment for verifying that this distinction is possible was made. In the following, experimental results will be shown.

Figure 31:
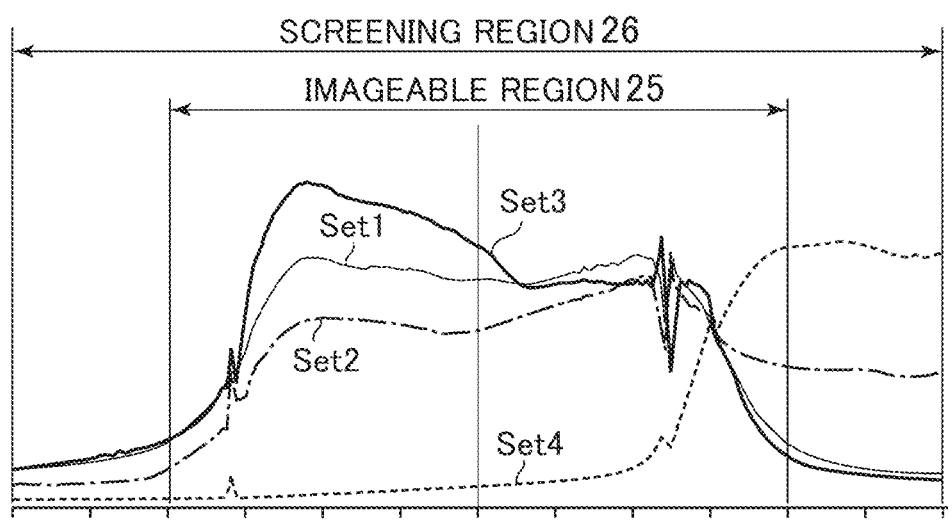
FIG. 31 is a graph showing experimental results.

FIG. 31 is a graph showing the experimental results.

In the experiment, a phantom was installed on the cradle 3a and the front array coil 40 was installed on the phantom. Then, the coverage data were prepared in accordance with the procedures of step ST3. Referring to FIG. 31, a distinct difference in signal value between the coverage data C1-C3 of the coil modes Set1-Set3 and the coverage data C4 of the coil mode Set4 is observed. Thus, it is found that distinction between the coil modes Set1-Set3 which are high in sensitivity in the SI direction and the coil mode Set4 which is low in sensitivity in the SI direction is possible.

In addition, in step ST4, the sensitivity maps are prepared on the basis of the projection data. Thus, a simple experiment for verifying to which extent of quality the sensitivity maps prepared on the basis of the projection data have was made. In the following, experimental results will be shown.

Figure 32A:
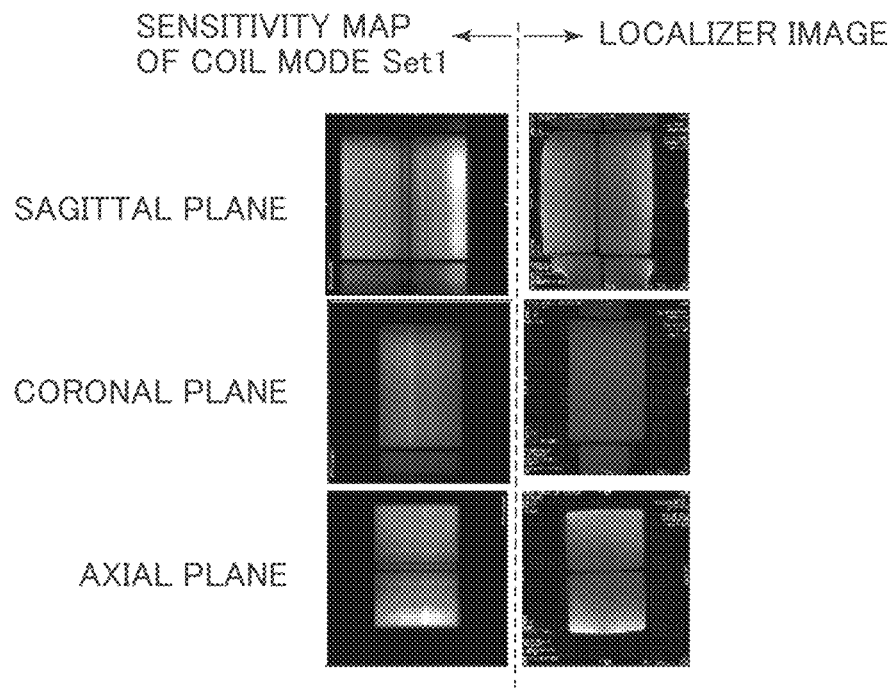
FIGS. 32A and 32B are graphs showing experimental results.
Figure 32B:
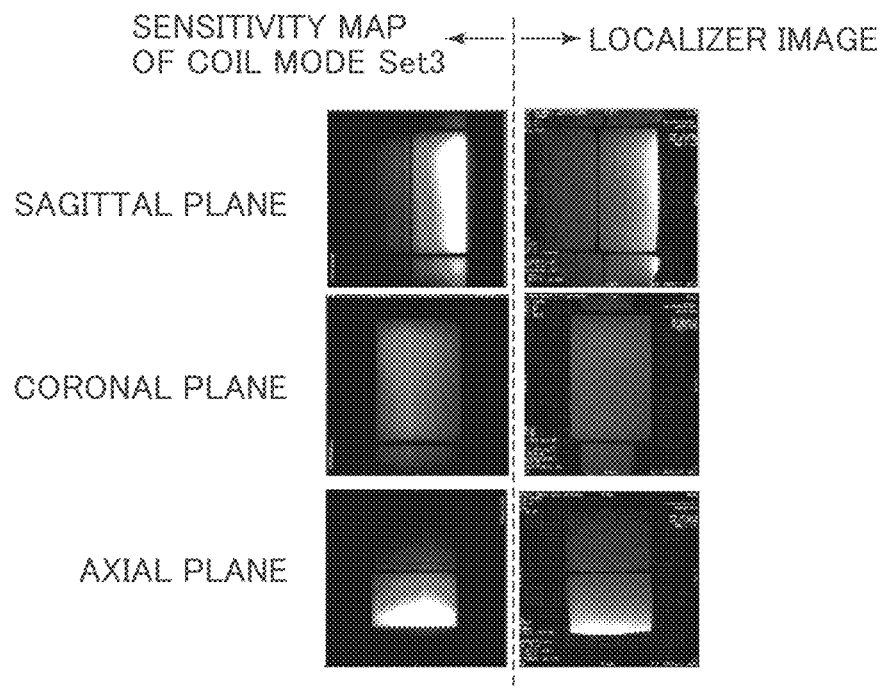

FIGS. 32A and 32B are graphs showing the experimental results.

In the experiment, a phantom was installed on the cradle 3a and the front array coil 40 was installed on the phantom. Then, the sensitivity map of the coil mode Set1 and the sensitivity map of the coil mode Set3 were prepared in accordance with the procedures of step ST4. FIG. 32A shows the sagittal plane, the coronal plane and the axial plane of the sensitivity map of the coil mode Set1, and FIG. 32B shows the sagittal plane, the coronal plane and the axial plane of the sensitivity map of the coil mode Set3. In addition, a localizer image of a corresponding section is shown on the right side of each sensitivity map. Comparison of the sensitivity map with the localizer image shows that the sensitivity map exhibits a tendency toward contrasts of light against dark which would be the same as that of the localizer image and hence it is found that the reliability of the sensitivity map is high.

Incidentally, in the exemplary embodiment, the following coil modes are set as available coil modes.

(1) The coil mode Set1: the front array coil 40+the rear array 41a (2) The coil mode Set2: the front array coil 40+the rear array 41b (3) The coil mode Set3: the rear array 41a (4) The coil mode Set4: the rear array 41b However, available coil modes are not limited to Set1-Set4. In the following, other examples of the available coil modes will be shown.

(1) The coil mode Set1: the front array coil+the rear array 41a (2) The coil mode Set2: the front array coil 40+the rear array 41b (3) The coil mode Set3: the rear array 41a (4) The coil mode Set4: the rear array 41b (5) A coil mode Set5: the rear array 41a+the rear array 41b In this example, the coil mode Set5 is added in addition to the coil modes Set1-Set4. Thus, in step ST3, a scan $A_5$ using the coil mode Set5 may be executed in addition to the scans $A_1$-$A_4$ using the coil modes Set1-Set4. Since it is possible to prepare projection data of the coil mode Set5 by the scan A4 using the coil mode Set5, coverage data of the coil mode Set5 can be obtained by dividing it by the projection data of the RF coil. Incidentally, since the coil mode Set5 is configured by the coil modes Set3 and Set4, the projection data of the coil mode Set5 may be estimated from the projection data of the coil mode Set3 and the projection data of the coil mode Set4. In the case that the projection data of the coil mode Set5 is estimated from the projection data of the coil mode Set3 and the projection data of the coil mode Set4, a scan using the coil mode Set5 is not needed and hence it becomes possible to prevent the scan time taken in step ST3 from being increased.

Many widely different embodiments may be configured without departing from the spirit and the scope of the disclosure. It should be understood that the disclosure is not limited to the specific embodiments described in the specification, except as defined in the appended claims.

The disclosure is directed to the magnetic resonance apparatus which prepares the sensitivity map of the coil mode, and the apparatus can select a coil mode suited for a predetermined scan.

What is claimed is:

1. A magnetic resonance imaging (MRI) apparatus comprising:
    a magnet forming a static magnetic field;
    a gradient coil generating a gradient magnetic field;
    an RF coil transmitting an RF pulse and receiving magnetic resonance signals;
    a coil device including a plurality of array coils, each having a plurality of coil elements, the coil device having a plurality of coil modes, wherein each of the plurality of coil modes represents a combination of coil elements for use in scanning a subject;
    a data preparing unit configured to prepare sensitivity data that includes sensitivities of the plurality of coil modes in respective predetermined directions;
    a selecting unit configured to select, from the plurality of coil modes, a selected coil mode for use in executing a scan on the subject;
    a scanning unit configured to execute a first scan for acquiring data on the subject using the selected coil mode; and
    a sensitivity map preparing unit configured to prepare a sensitivity map of the selected coil mode based on data obtained by the first scan;
    wherein the selecting unit is configured to select the coil mode from the plurality of coil modes based on a threshold value of the sensitivity data.

2. The MRI apparatus of claim 1, wherein the scanning unit is configured to execute the first scan such that although a gradient magnetic field is applied to each of a plurality of sections crossing the subject in a frequency encoding direction, the gradient magnetic field is not applied in a phase encoding direction using the selected coil mode; and the sensitivity map preparing unit is configured to prepare projection data that includes data which has been projected in the phase encoding direction by each of the plurality of sections crossing the subject based on data obtained in the first scan, and configured to prepare the sensitivity map using the projection data.

3. The MRI apparatus of claim 2, wherein the scanning unit is configured to execute the first scan using the RF coil; and the sensitivity map preparing unit is configured to prepare projection data when the RF coil has been used based on data obtained by the first scan using the RF coil, and configured to prepare the sensitivity map using the projection data when the RF coil has been used and the projection data when the selected coil mode has been used.

4. The MRI apparatus of claim 2, wherein in the first scan, the frequency encoding direction is set in a plurality of directions for each of a plurality of sections crossing the subject.

5. The MRI apparatus of claim 4, wherein a sagittal plane, an axial plane and a coronal plane are included in the plurality of sections; and in the first scan the frequency encoding direction is set in a superior-inferior (SI) direction and an anterior-posterior (AP) direction for the sagittal plane; the frequency encoding direction is set in the AP direction and an a right-left (RL) direction for the axial plane; and the frequency encoding direction is set in the RL direction and the SI direction for the coronal plane.

6. The MRI apparatus of claim 1, wherein the scanning unit is configured to execute a second scan such that although a gradient magnetic field is applied to each of a plurality of sections crossing the subject in a frequency encoding direction, the gradient magnetic field is not applied in a phase encoding direction using one of the plurality of coil modes; and the data preparing unit is configured to prepare projection data that includes data which has been projected in the phase encoding direction based on data obtained in the second scan, and configured to prepare sensitivity data using the projection data.

7. The MRI apparatus of claim 6, wherein the scanning unit is configured to execute the second scan using the RF coil; and the sensitivity preparing unit is configured to prepare projection data when the RF coil has been used based on data obtained by the second scan using the RF coil, and configured to prepare the sensitivity map using the projection data when the RF coil has been used and the projection data when the selected coil mode has been used.

8. The MRI apparatus of claim 1, further comprising a display unit configured to display the sensitivity map.

9. The MRI apparatus of claim 8, further comprising a sensitivity score calculating unit configured to calculate a sensitivity score indicating a sensitivity in a predetermined range of the sensitivity map.

10. The MRI apparatus of claim 9, wherein the predetermined range of the sensitivity map is a range of an imaging view field of the scan.

11. The MRI apparatus of claim 9, wherein the selecting unit is configured to select a plurality of coil modes; the sensitivity map preparing unit is configured to prepare a sensitivity map for each of the selected coil modes; the sensitivity score calculating unit is configured to calculate a sensitivity score of each sensitivity map; and the display unit is configured to display a sensitivity map which is the highest in sensitivity score.

12. The MRI apparatus of claim 10, wherein the scan is a scan for acquiring image data on a region of interest of the subject, and the display unit is configured to display the sensitivity map and the image data one upon another.

* * * * *